US011380514B2

(12) United States Patent
Tamaki

(10) Patent No.: US 11,380,514 B2
(45) Date of Patent: Jul. 5, 2022

(54) CHARGED PARTICLE BEAM SYSTEM

(71) Applicant: Hitachi High-Tech Corporation, Tokyo (JP)

(72) Inventor: Hirokazu Tamaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/279,041

(22) PCT Filed: Oct. 10, 2018

(86) PCT No.: PCT/JP2018/037738
§ 371 (c)(1),
(2) Date: Mar. 23, 2021

(87) PCT Pub. No.: WO2020/075241
PCT Pub. Date: Apr. 16, 2020

(65) Prior Publication Data
US 2022/0005667 A1 Jan. 6, 2022

(51) Int. Cl.
*H01J 37/21* (2006.01)
*H01J 37/22* (2006.01)
*H01J 37/28* (2006.01)

(52) U.S. Cl.
CPC .............. *H01J 37/21* (2013.01); *H01J 37/22* (2013.01); *H01J 37/28* (2013.01)

(58) Field of Classification Search
CPC .. H01J 37/00; H01J 37/02; H01J 37/21; H01J 37/22; H01J 37/222; H01J 37/26;
(Continued)

(56) References Cited

U.S. PATENT DOCUMENTS 5,793,041 A 8/1998 Ogasawara et al.
2005/0092930 A1 5/2005 Watanabe et al.
(Continued)

FOREIGN PATENT DOCUMENTS

JP 58-137948 A 8/1983
JP 9-82257 A 3/1997
(Continued)

OTHER PUBLICATIONS

International Search Report (PCT/ISA/210) issued in PCT Application No. PCT/JP2018/037738 dated Dec. 25, 2018 with English translation (five (5) pages).
(Continued)

*Primary Examiner* — Jason L McCormack
(74) *Attorney, Agent, or Firm* — Crowell & Moring LLP

(57) ABSTRACT

A control system of a charged particle beam apparatus obtains a first coefficient by performing multiple resolution analysis based on wavelet transform or discrete wavelet transform on at least a part of an image or a signal acquired by the charged particle beam apparatus. The control system obtains a second coefficient by performing, on at least a part of the first coefficient or an absolute value of the first coefficient, any one of calculation of a maximum value, calculation of a numerical value corresponding to a specified order in an order related to a magnitude, fitting to a histogram, calculation of an average value, and calculation of a total sum.

20 Claims, 23 Drawing Sheets

(58) Field of Classification Search
CPC .. H01J 37/28; H01J 37/153; H01J 2237/1532; H01J 2237/2802
USPC .............................. 250/396 R, 306, 307, 311
See application file for complete search history.

(56) References Cited

U.S. PATENT DOCUMENTS

2005/0249414 A1\* 11/2005 Uehara .............. G01N 21/8851
                                                 382/181
2018/0031498 A1    2/2018 Shiratsuchi et al.

FOREIGN PATENT DOCUMENTS

| JP | 2001-68048 A | 3/2001 |
| JP | 2018-17571 A | 2/2018 |
| WO | WO 2004/093006 A1 | 10/2004 |

OTHER PUBLICATIONS

Japanese-language Written Opinion (PCT/ISA/237) issued in PCT Application No. PCT/JP2018/037738 dated Dec. 25, 2018 (four (4) pages).

\* cited by examiner

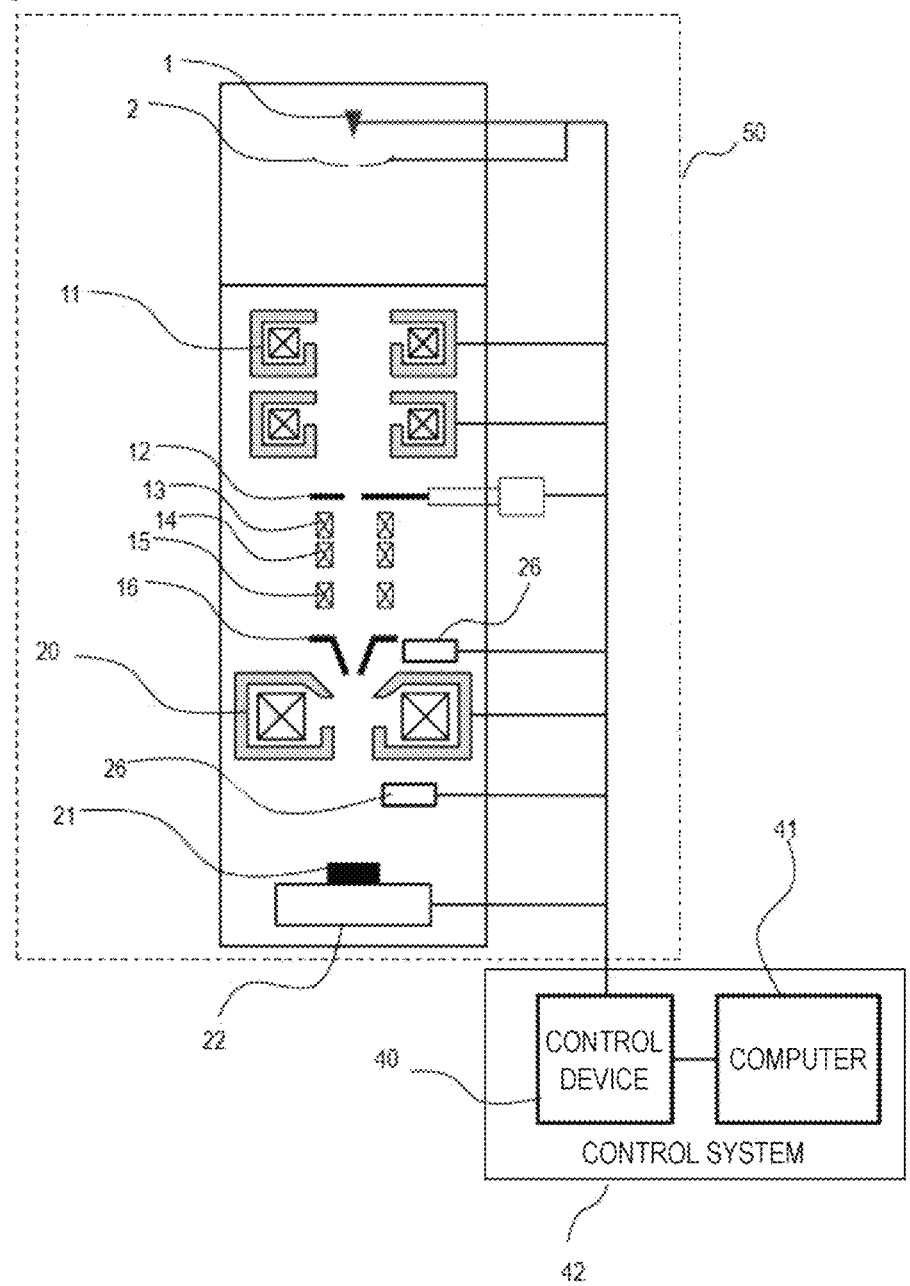
[Fig. 1]

[Fig. 2]
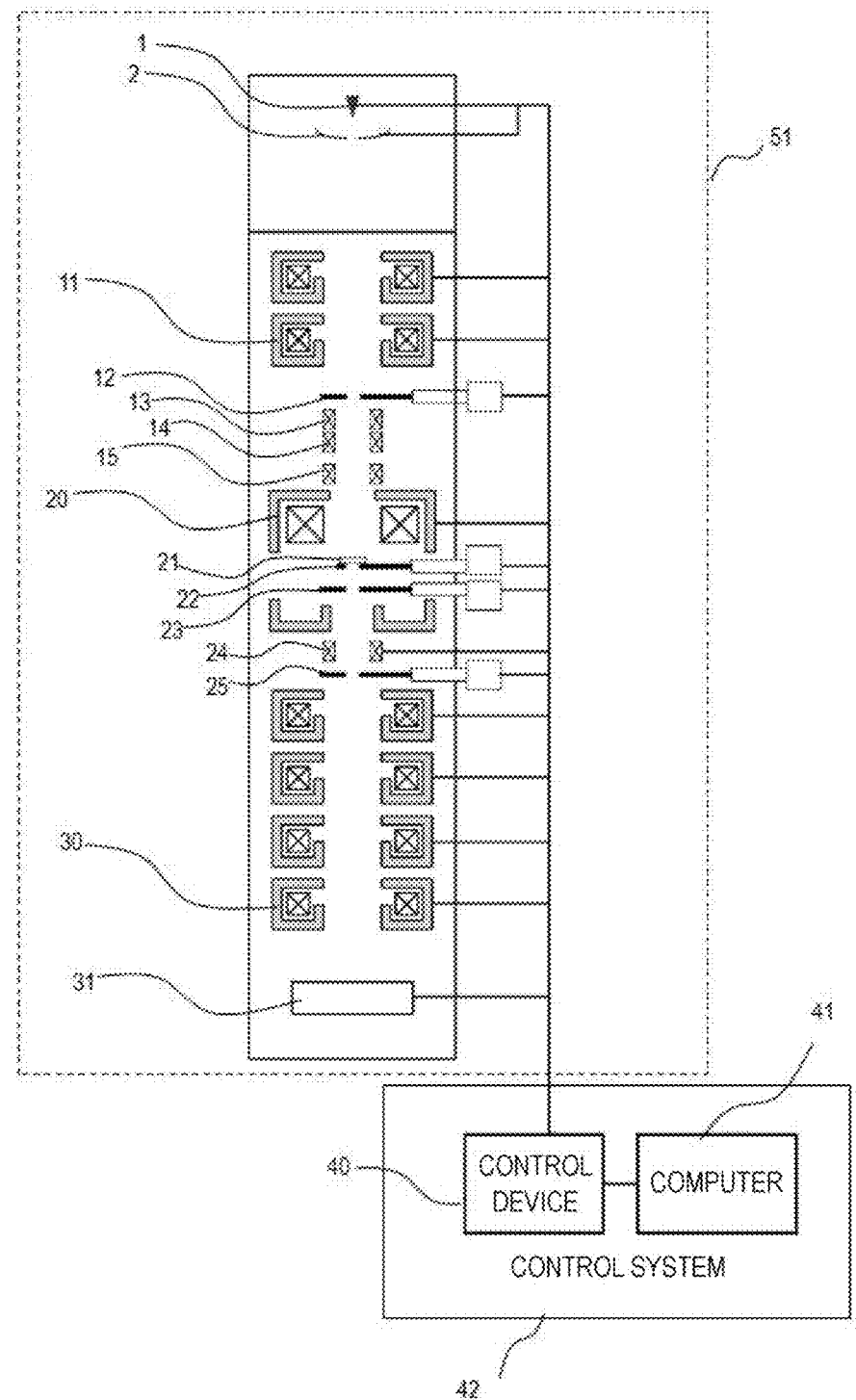

[Fig. 3]
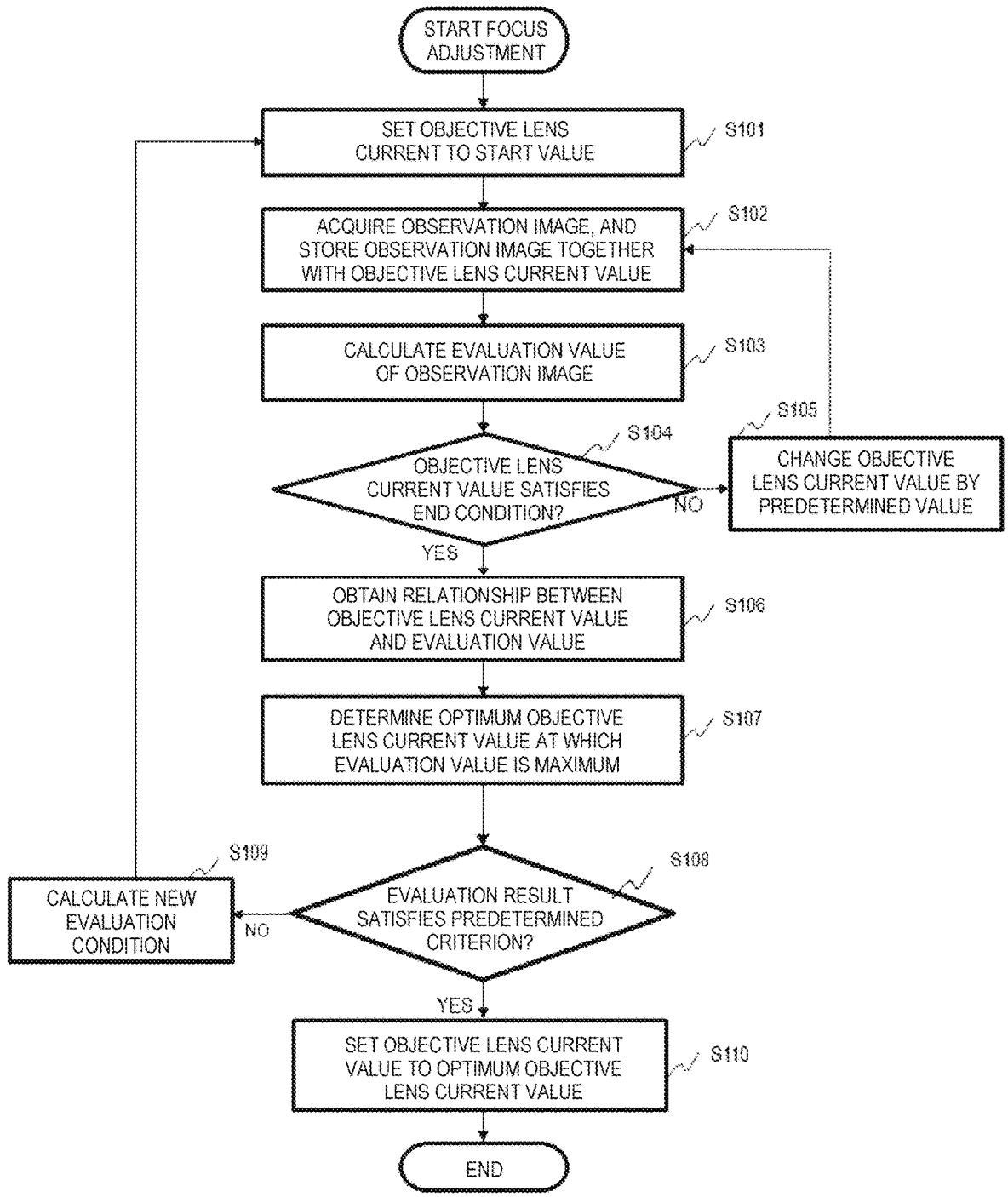

[Fig. 4A]
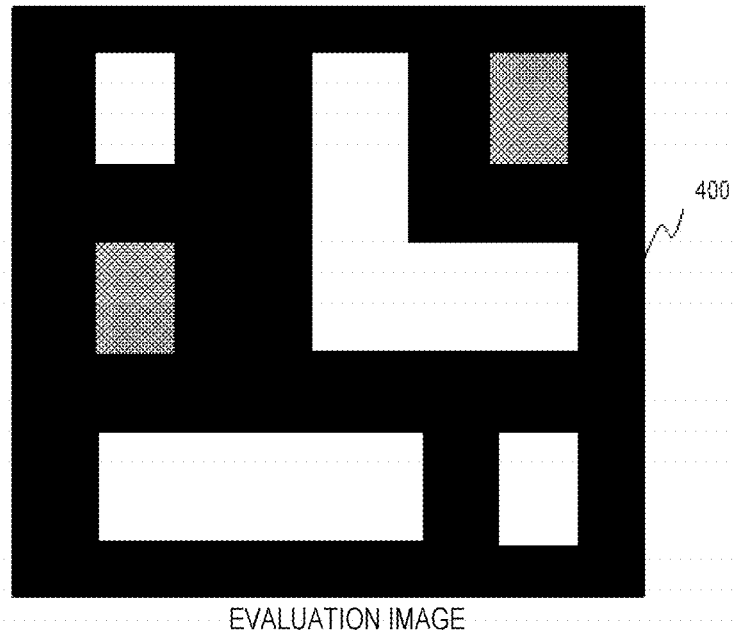
EVALUATION IMAGE
[Fig. 4B]
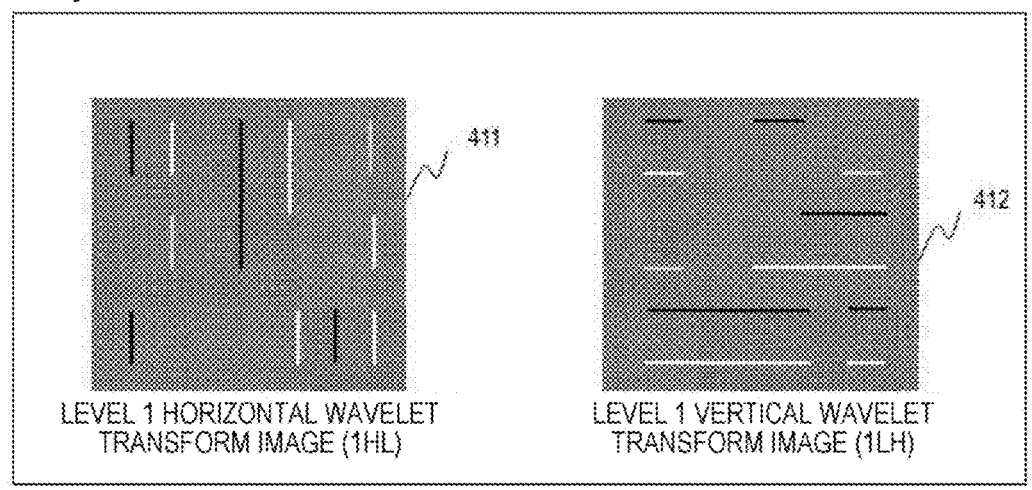
LEVEL 1 HORIZONTAL WAVELET TRANSFORM IMAGE (1HL)
LEVEL 1 VERTICAL WAVELET TRANSFORM IMAGE (1LH)

[Fig. 5]
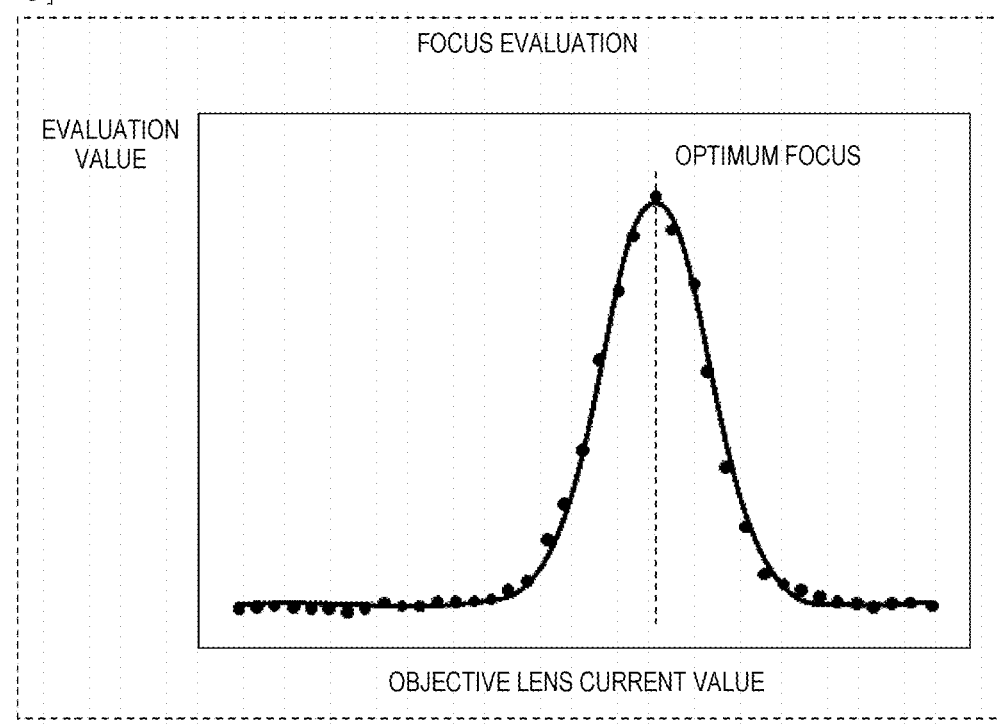

[Fig. 6A]
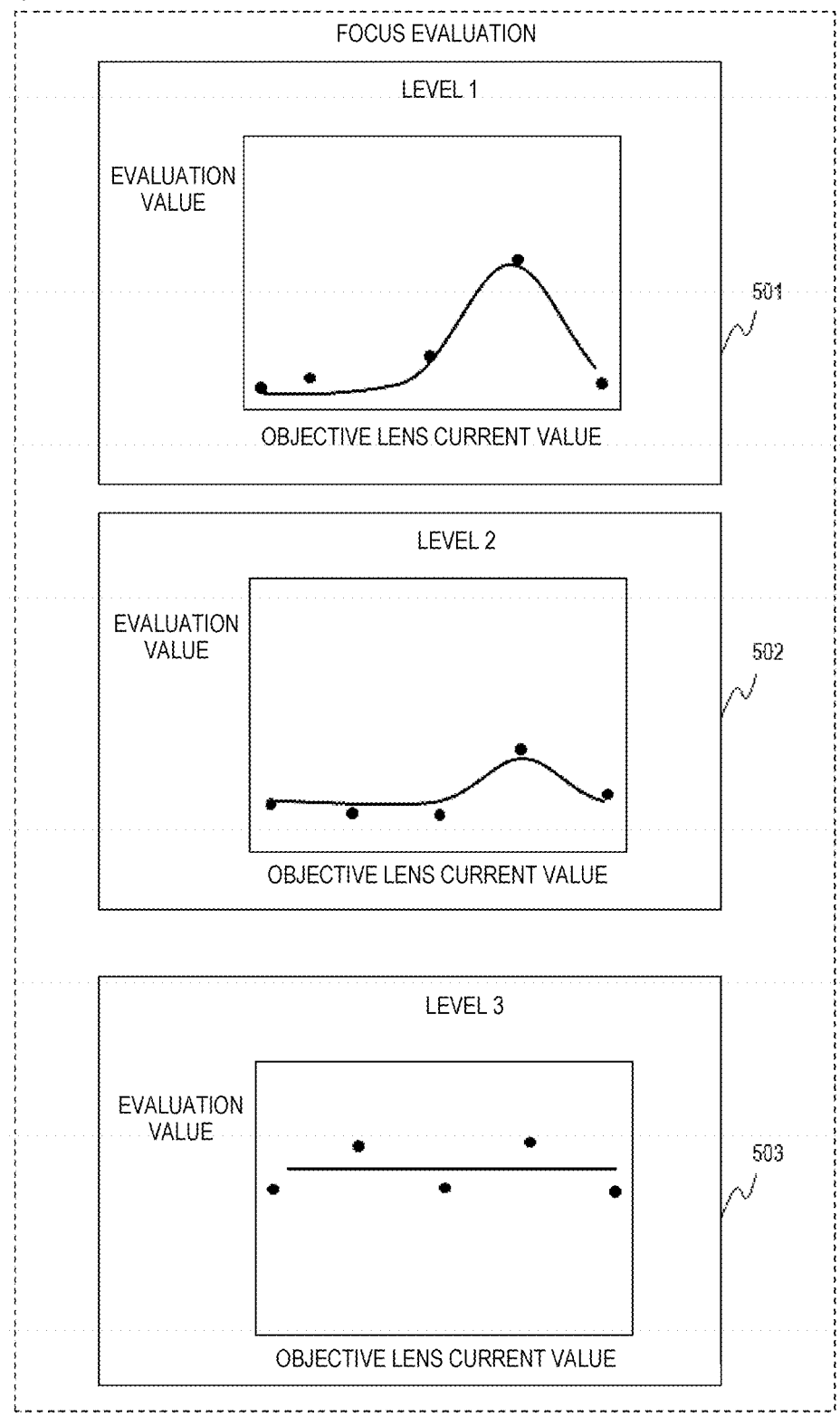

[Fig. 6B]
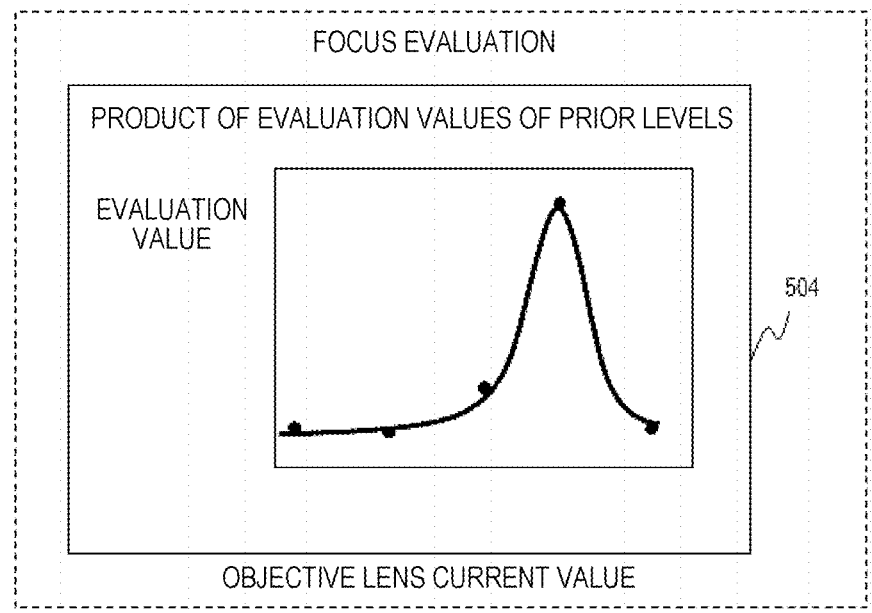

[Fig. 7]
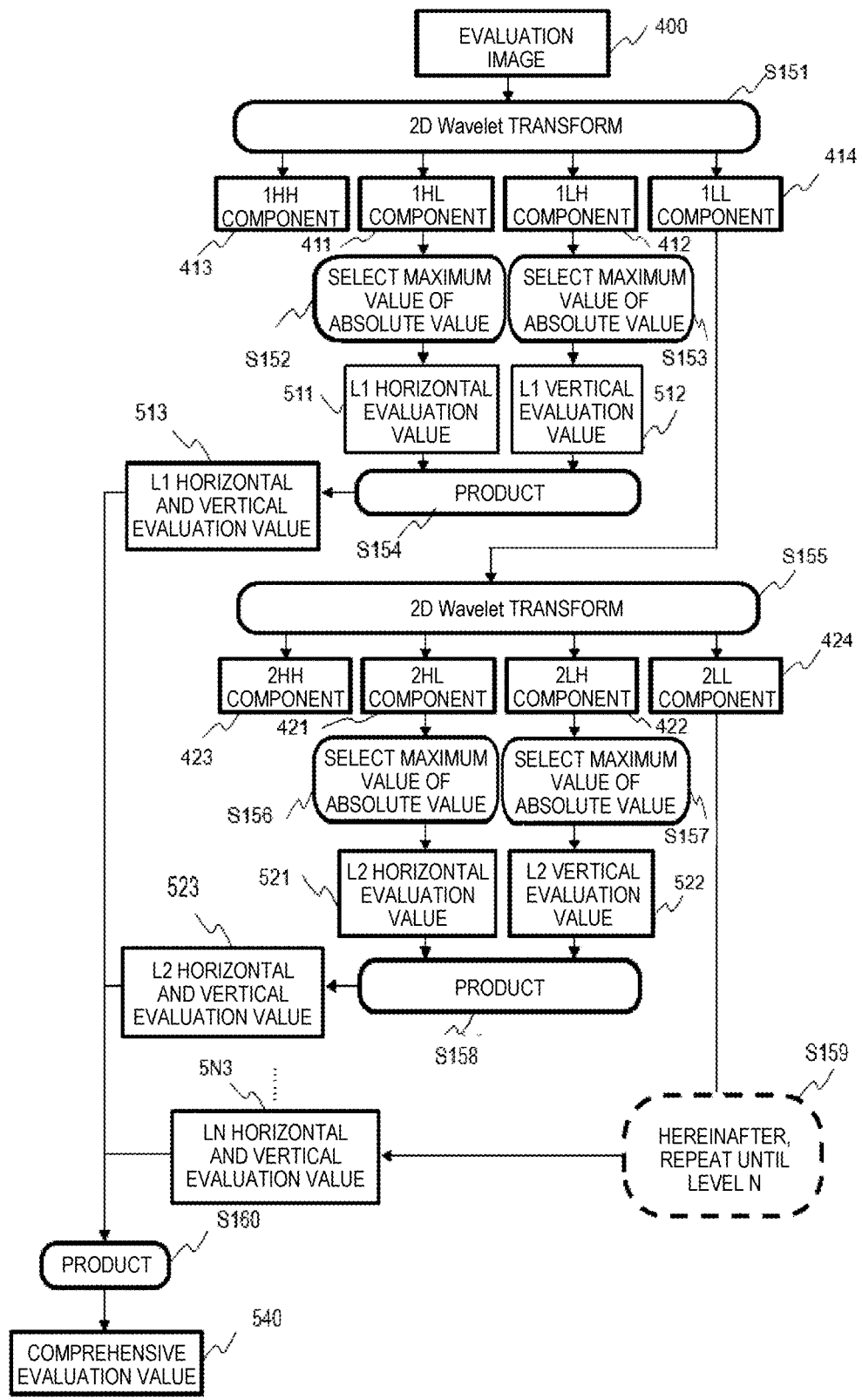

[Fig. 8]
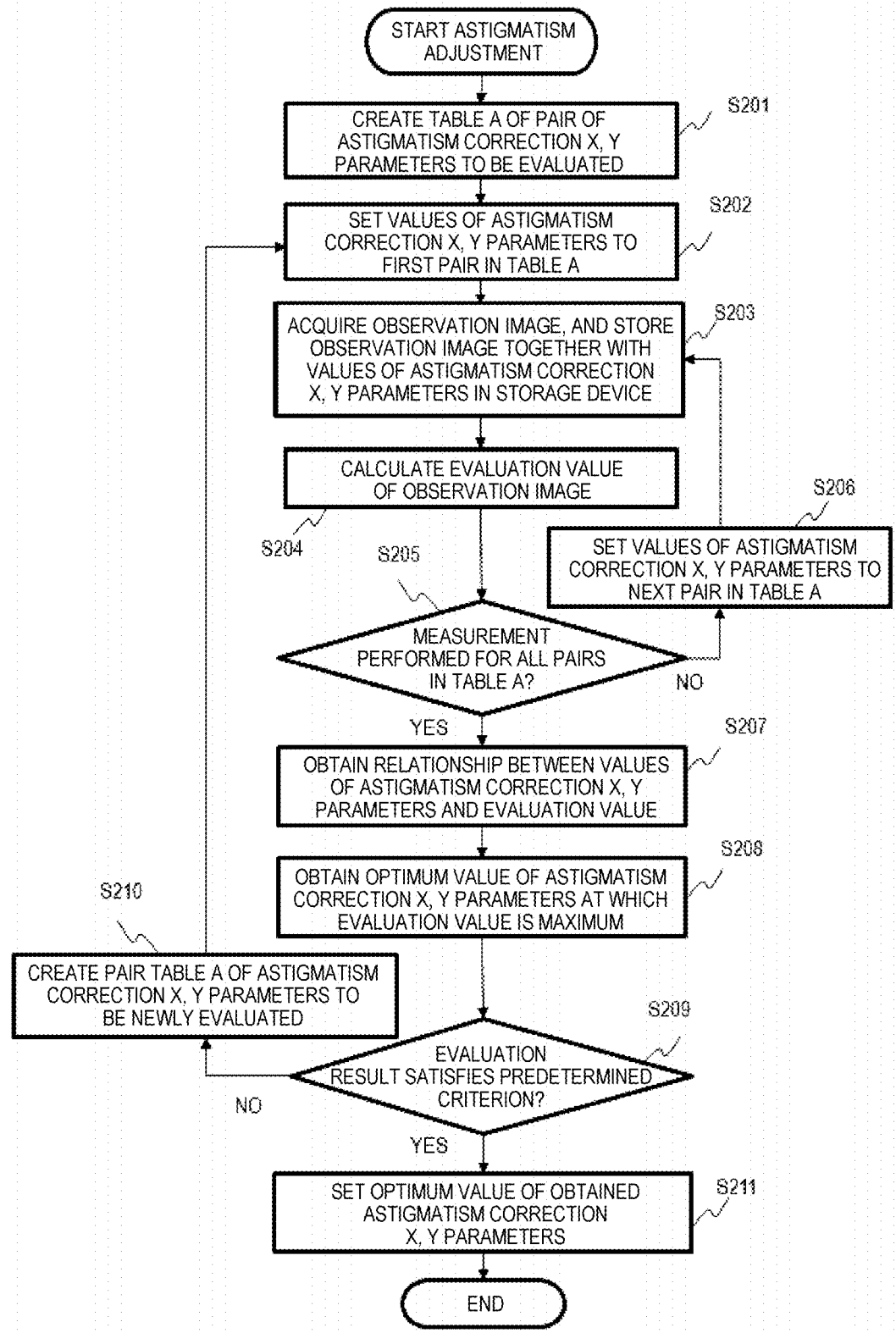

[Fig. 9]
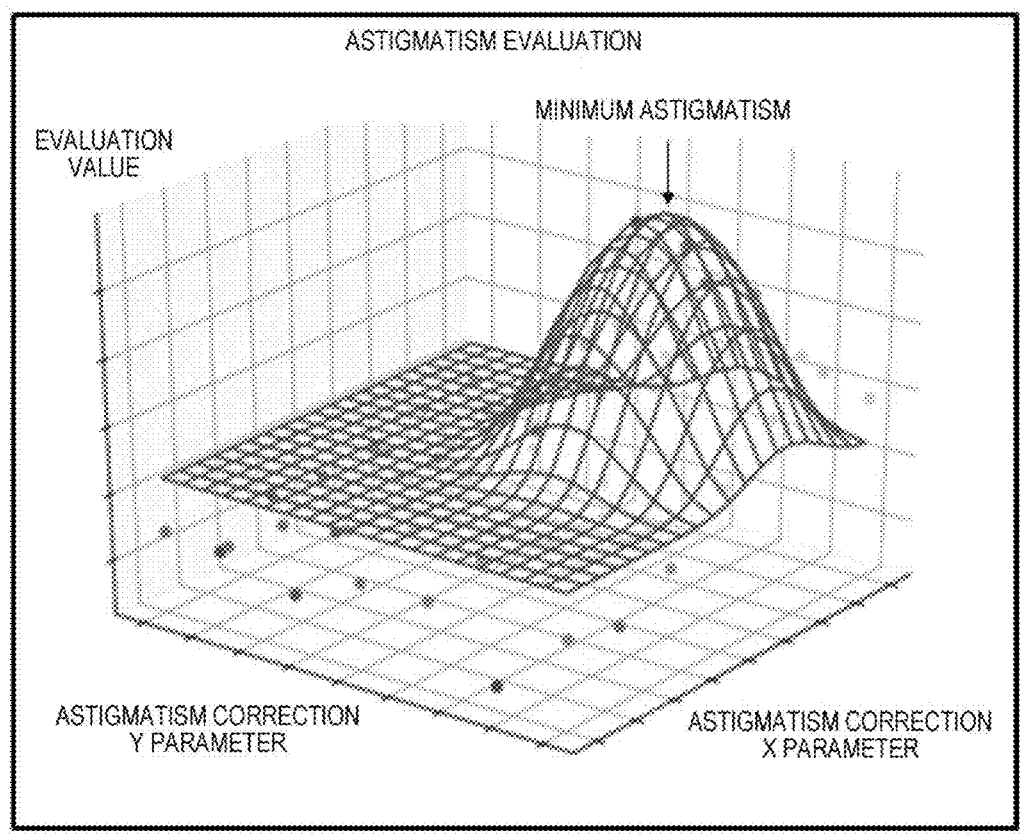

[Fig. 10]
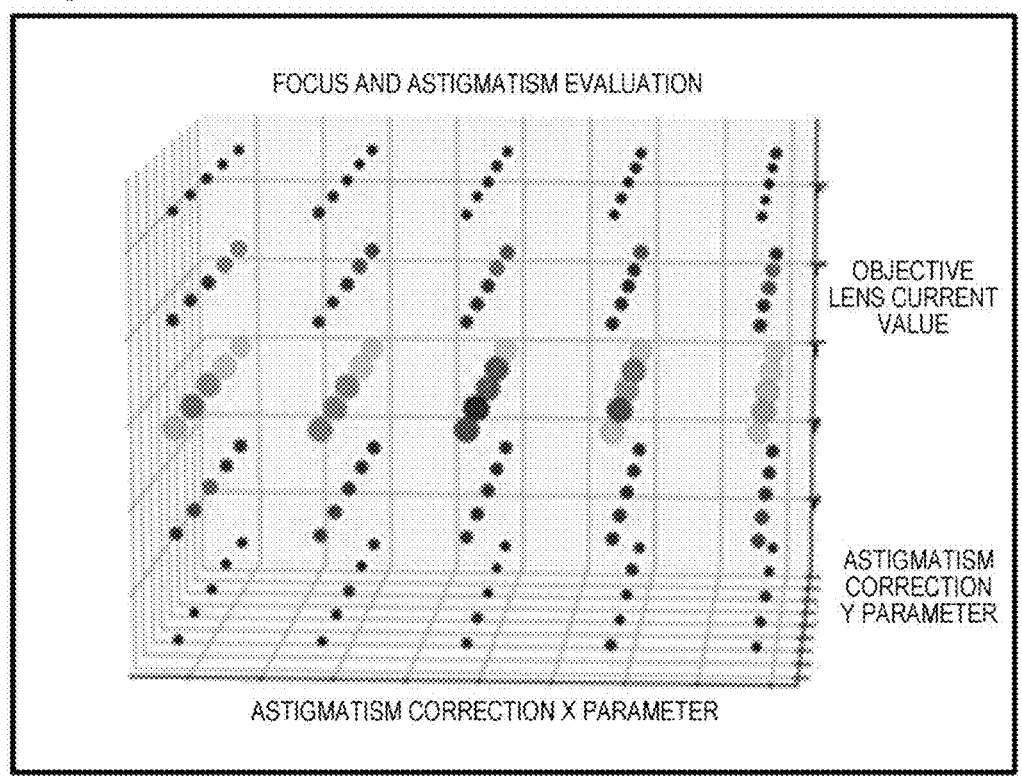

[Fig. 11]
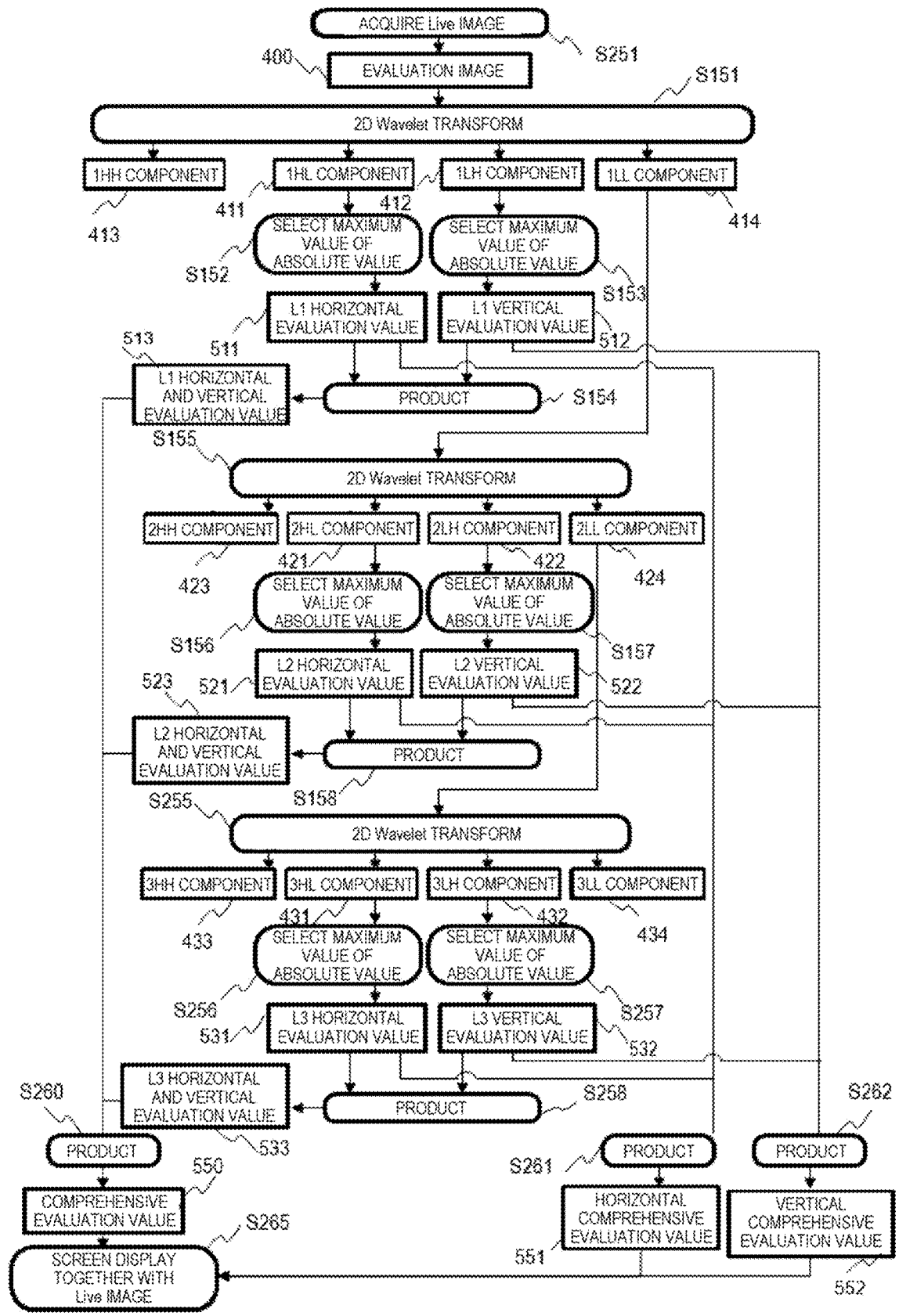

[Fig. 12A]
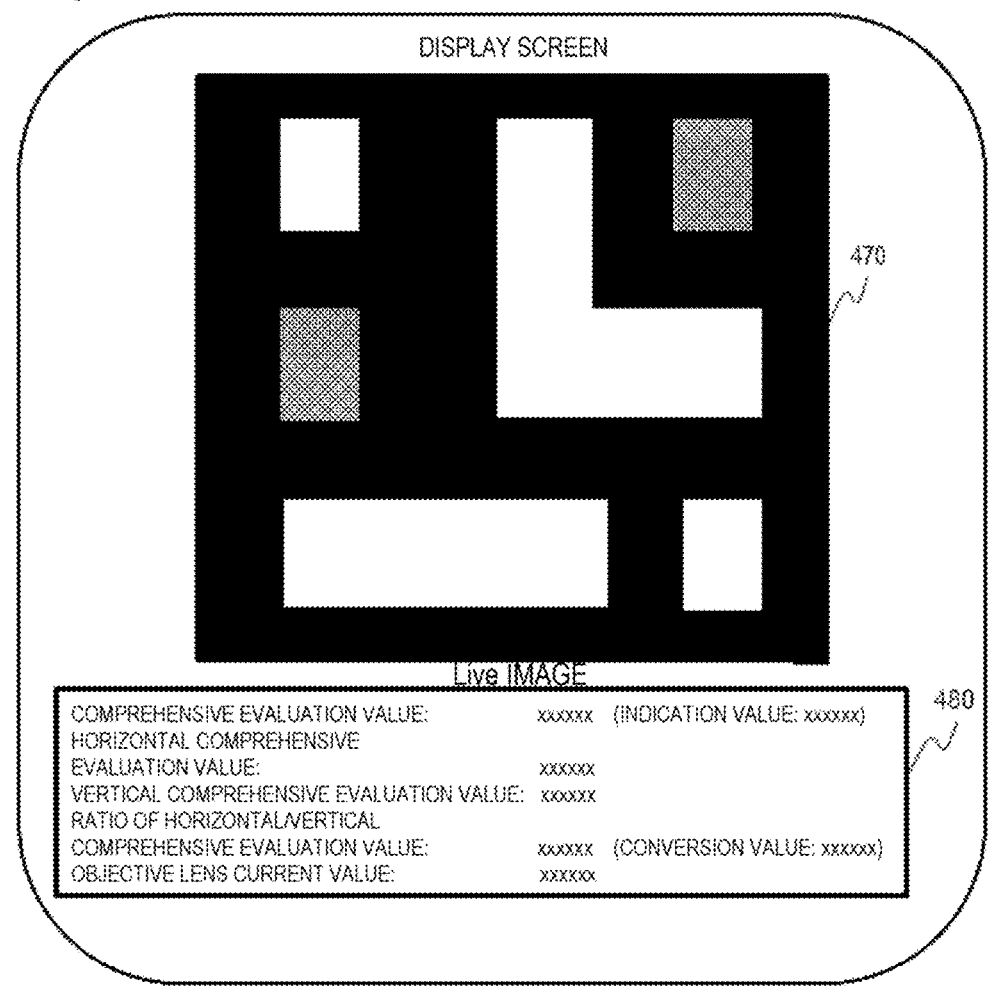

[Fig. 12B]
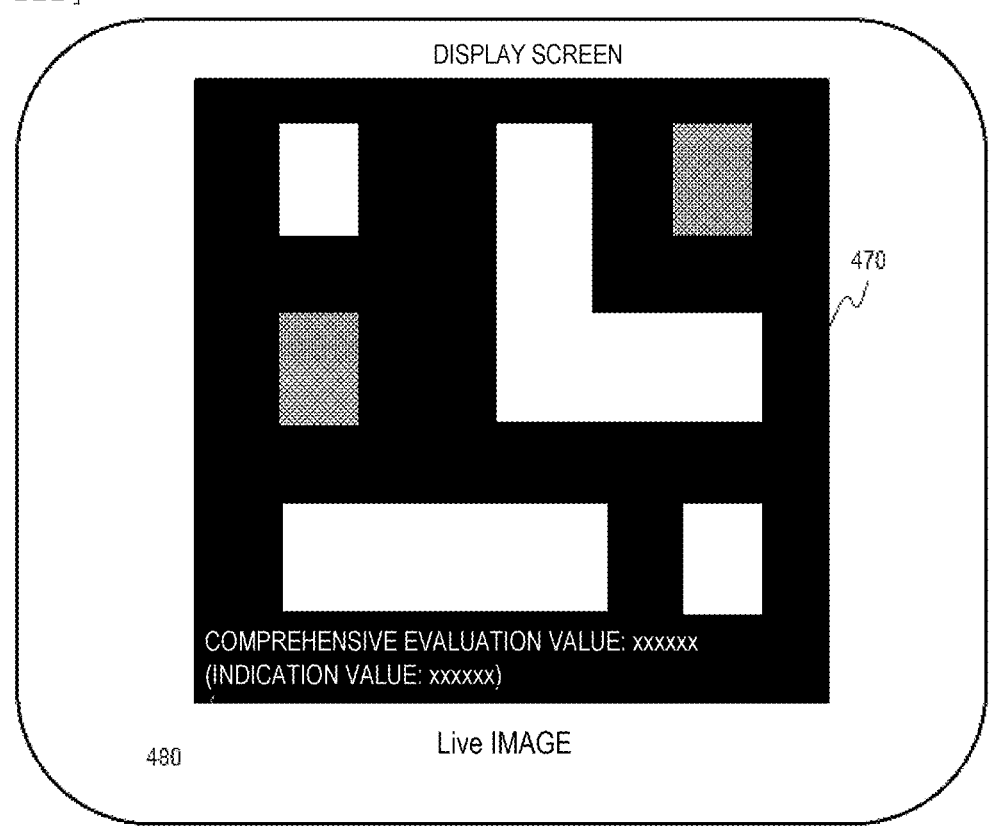

[Fig. 12C]
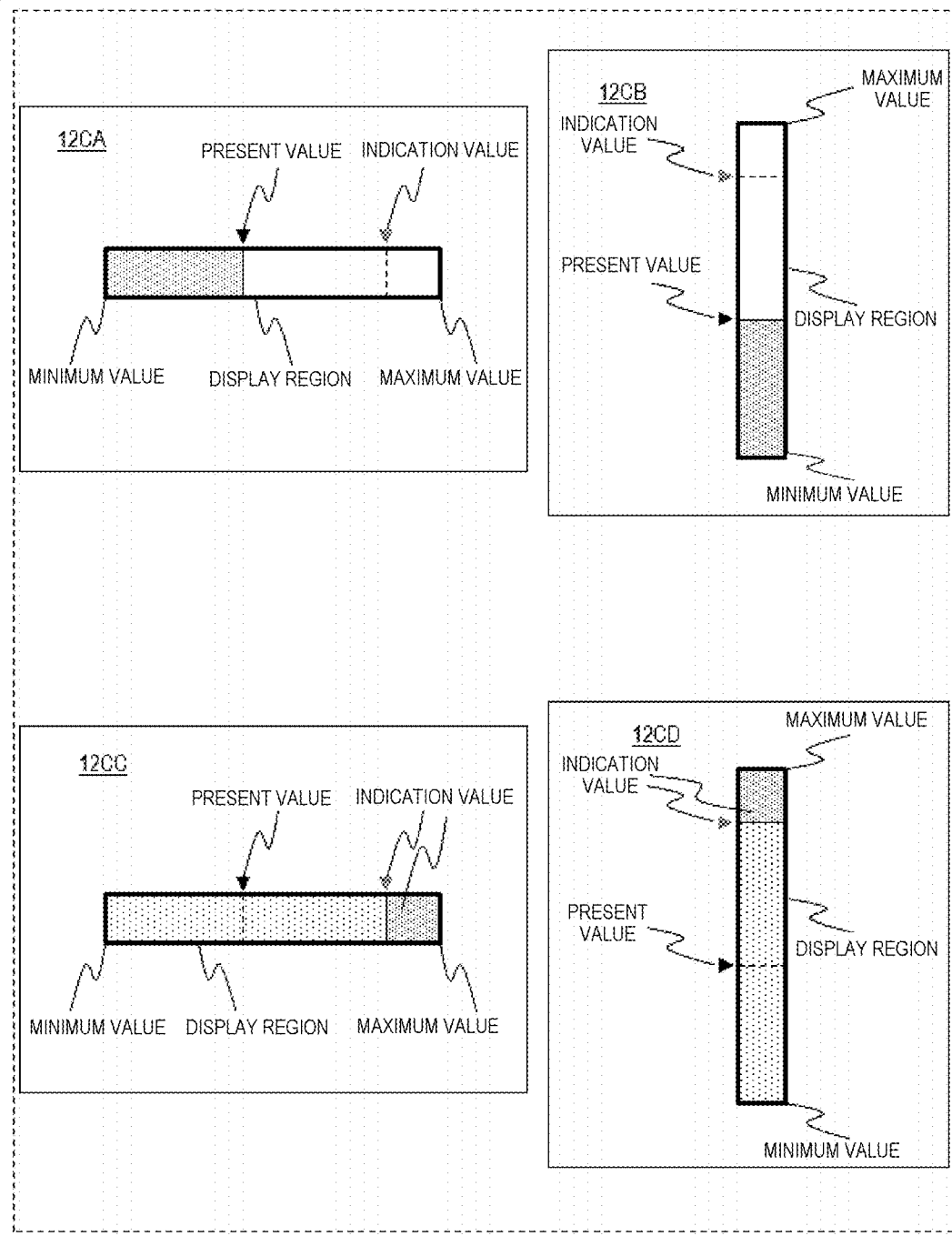

[Fig. 12D]
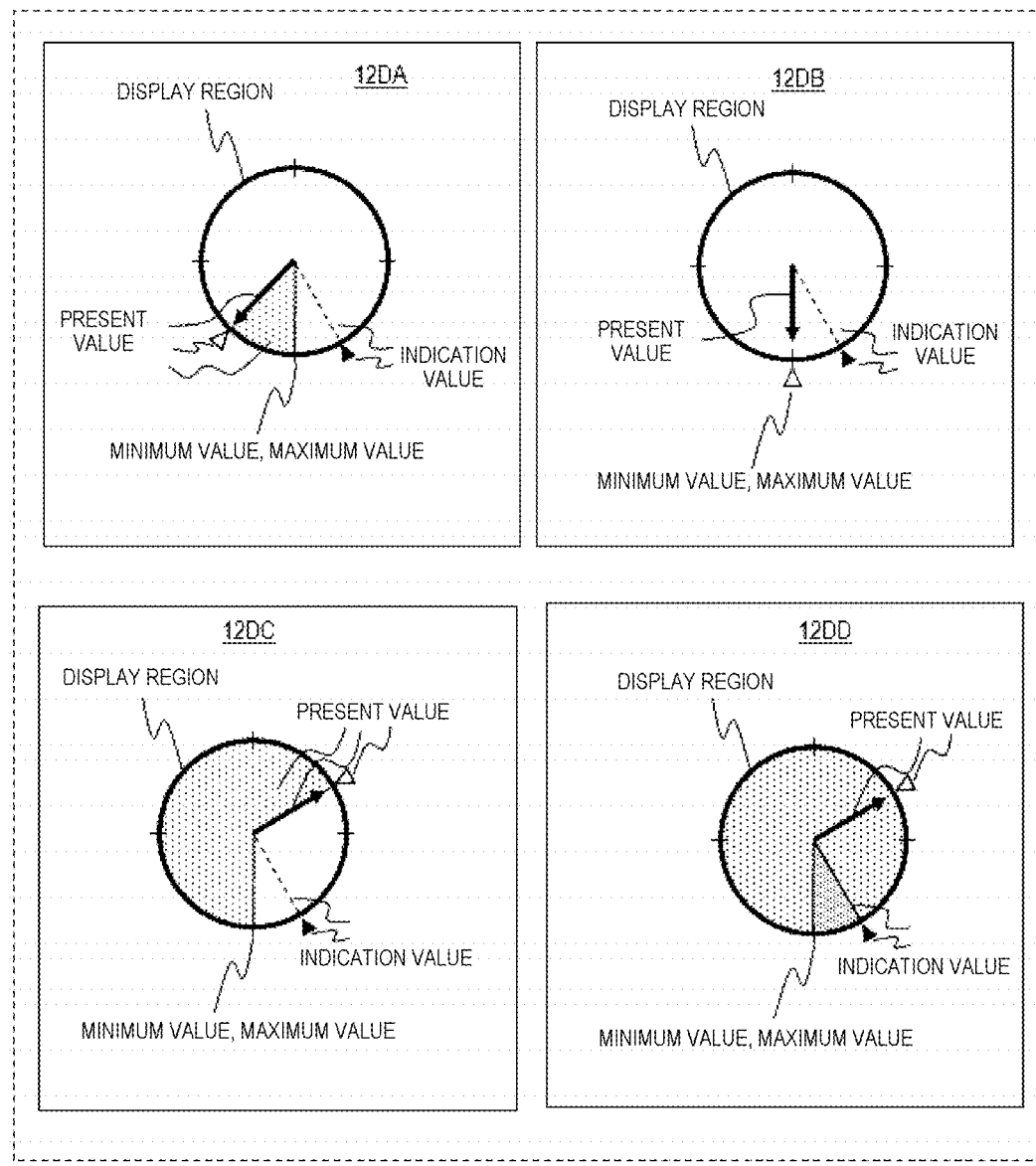

[Fig. 12E]
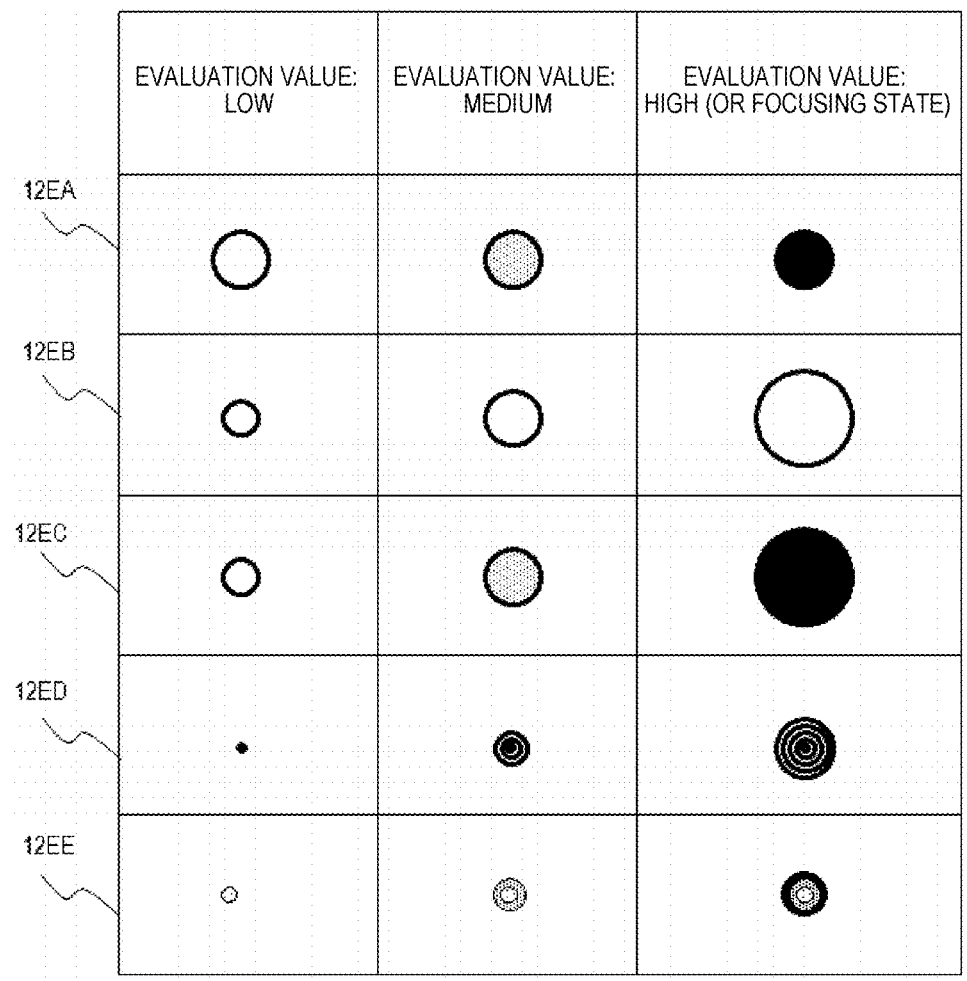

[Fig. 12F]

| | ASTIGMATISM ADJUSTMENT NOT ACHIEVED (VERTICAL EVALUATION VALUE IS LOW) | ASTIGMATISM OPTIMUM CONDITION | ASTIGMATISM ADJUSTMENT NOT ACHIEVED (HORIZONTAL EVALUATION VALUE IS LOW) |
|---|---|---|---|
| 12FA | | | |
| 12FB | | | |
| 12FC | | | |
| 12FD | | | |
| 12FE | | | |
| 12FF | | | |

[Fig. 12G]
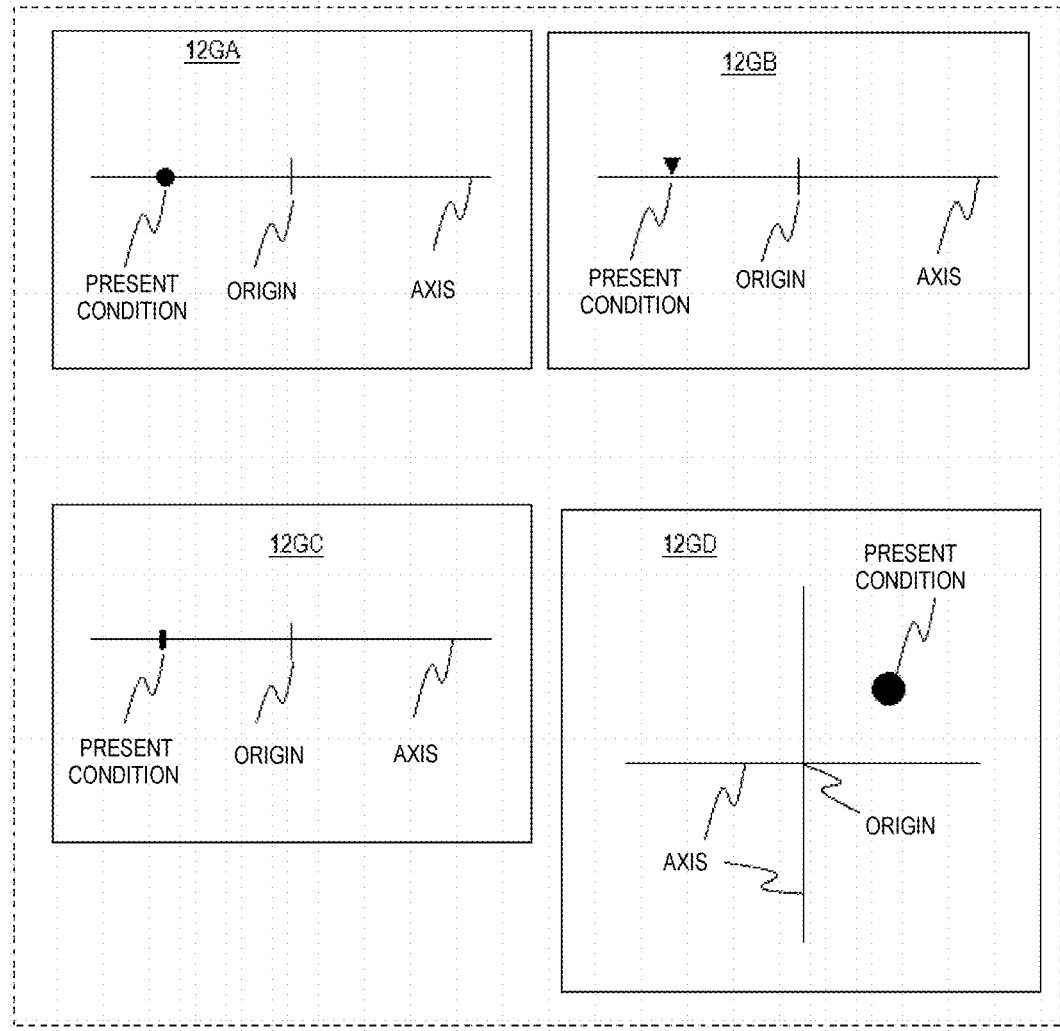

[Fig. 13]
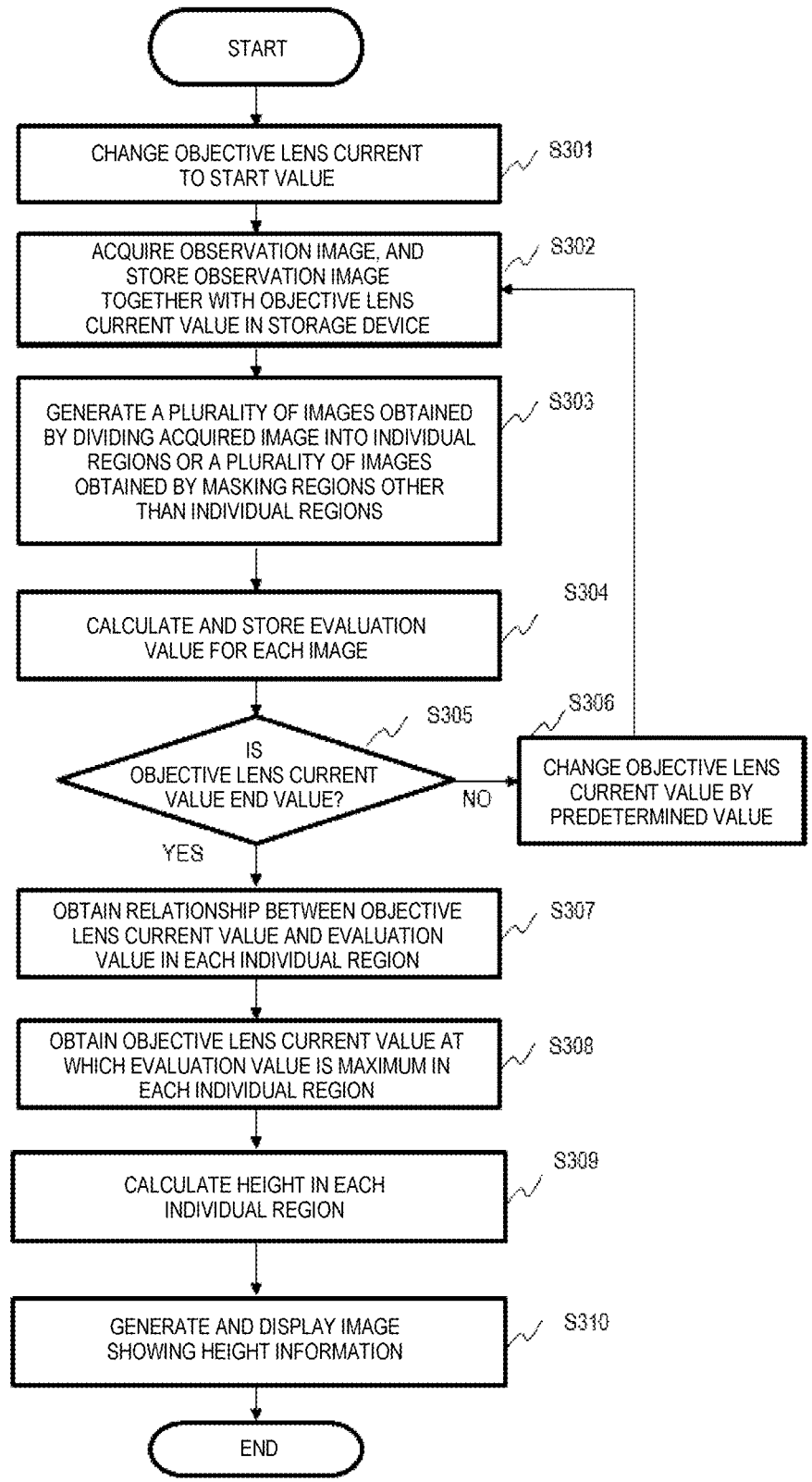

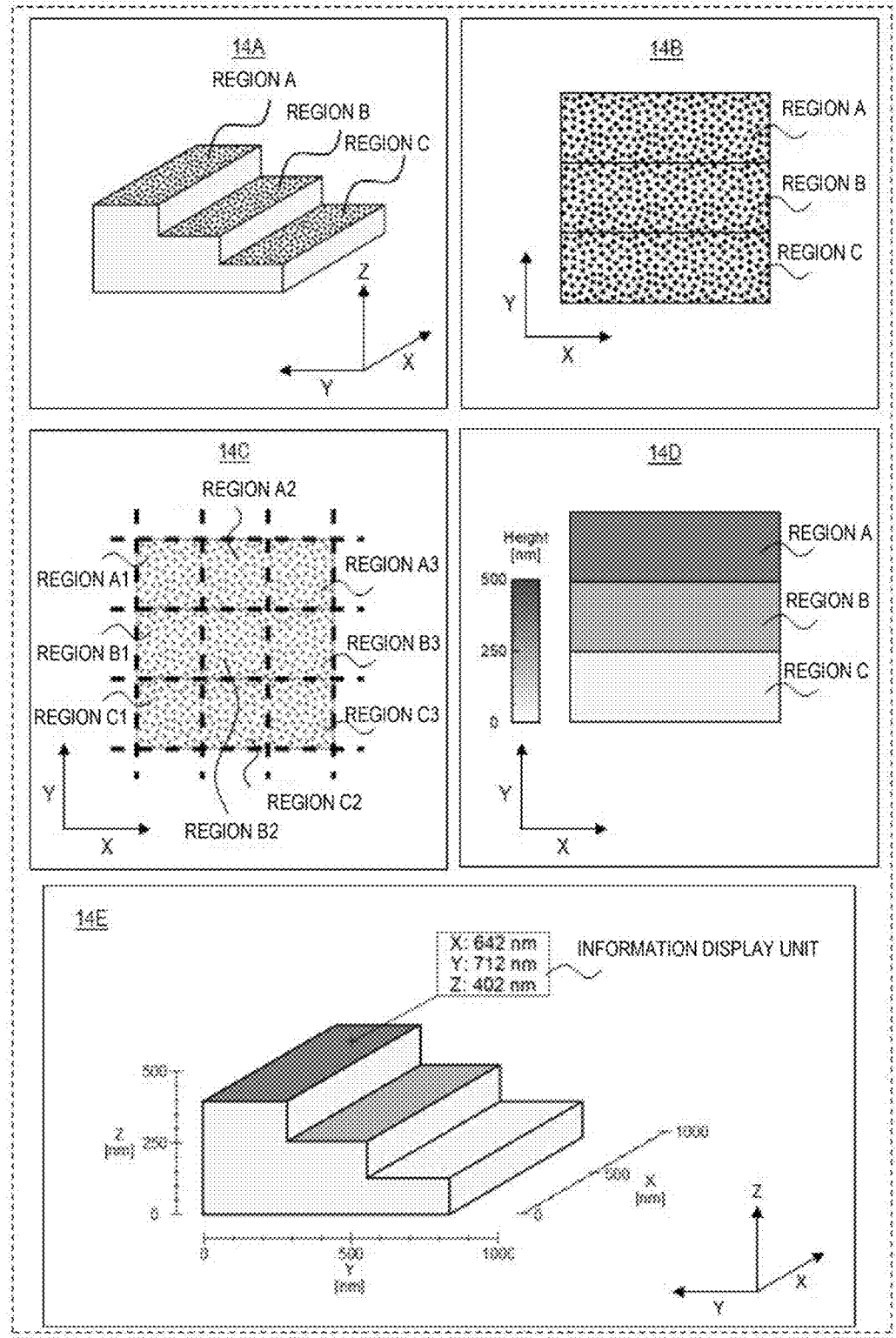
[Fig. 14]

[Fig. 15A]
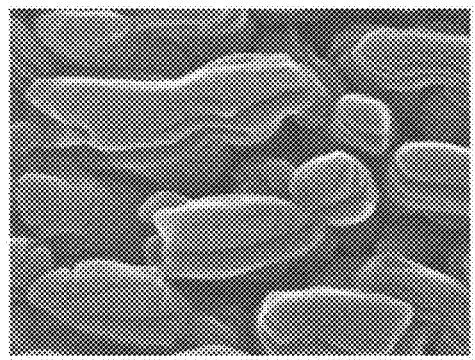
[Fig. 15B]
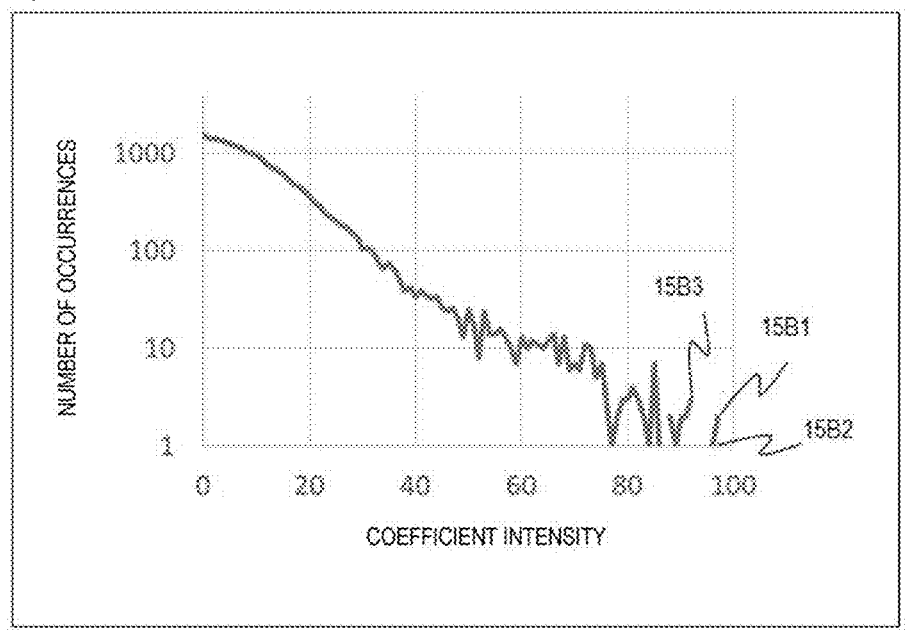

[Fig. 15C]
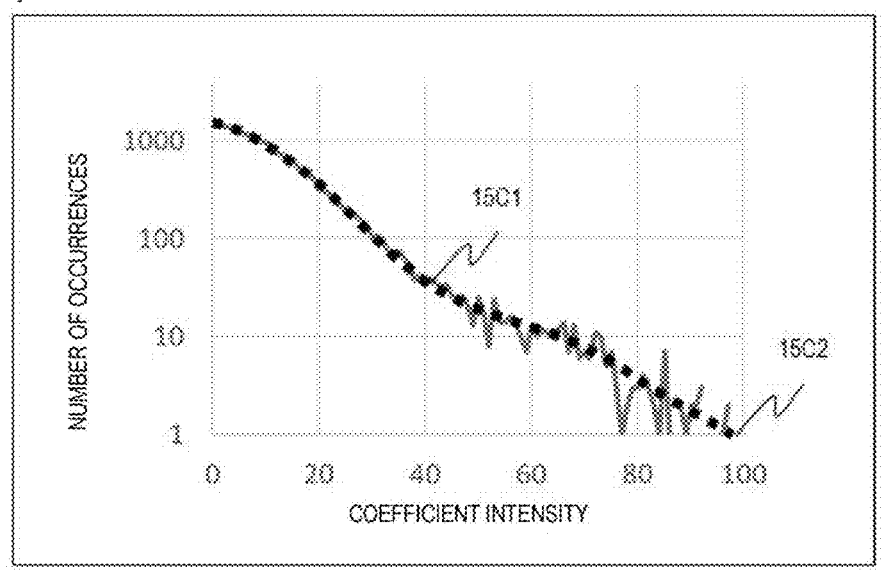

CHARGED PARTICLE BEAM SYSTEM

TECHNICAL FIELD

The present disclosure relates to a charged particle beam system.

BACKGROUND ART

As a background art of the present application, there is, for example, JP-A-9-82257 (PTL 1) JP-A-9-82257 discloses that "a charged particle optical lens barrel includes: a first step of extracting a secondary particle signal obtained by two-dimensionally scanning a sample with a charged particle beam in at least two different settings with different focal point lengths of an objective lens; a second step of defining a Fourier transform of each secondary particle signal extracted in the first step in a two-dimensional space as I(kx,ky) and |I'(kx,ky)|; a third step of calculating R(kx,ky) whose value is determined by a magnitude relationship between |I(kx,ky)| and |I'(kx,ky)|, which are absolute values of I(kx,ky) and I'(kx,ky) defined in the above second step; a fourth step of determining a direction of astigmatism from a when a component proportional to $\exp(i2\theta)$ or $\exp(-i2\theta)$ with respect to a direction of an angle $\theta$ on a kxky plane of the R(kx,ky) calculated in the third step is expressed as $A\exp(i(2\theta+\alpha))$ or $A\exp(-i(2\theta+\alpha))$ with respect to a positive real number A and a real number $\alpha$; and a fifth step of adjusting a stigma to minimize a real number A" (see CLAIMS).

JP-A-2001-68048 (PTL 2) discloses that "a small number of two-dimensional particle images acquired while changing a focal point are subjected to image processing to detect a direction and a magnitude of an astigmatic difference and a focal point offset, and the direction and the magnitude of the astigmatic difference and the focal point offset are collectively converted into two types of astigmatism correction amounts and focal point correction amounts to perform correction, thereby implementing high-speed and high-accuracy automatic astigmatic and focal point adjustment. A two-dimensional particle image having different focal points depending on positions in the image is obtained, and further high-speed automatic astigmatic and focal point adjustment is implemented. Further, by using the automatic astigmatic and focal point adjustment, an apparatus that implements highly accurate inspection and measurement over a long period of time is implemented" (see ABSTRACT).

CITATION LIST

Patent Literature

PTL 1: JP-A-9-82257
PTL 2: JP-A-2001-68048

SUMMARY OF INVENTION

Technical Problem

A charged particle beam apparatus capable of automatically measuring and adjusting focus and other aberrations is desired. Alternatively, a charged particle beam apparatus capable of measuring a three-dimensional shape of a sample based on a measurement result is desired.

Solution to Problem

A charged particle beam system according to an aspect of the disclosure includes: a charged particle beam apparatus; and a control system that analyzes an image obtained by the charged particle beam apparatus. The control system obtains a first coefficient by performing multiple resolution analysis based on wavelet transform or discrete wavelet transform on at least a part of an image or a signal acquired by the charged particle beam apparatus, and obtains a second coefficient by performing, on at least a part of the first coefficient or an absolute value of the first coefficient, any one of calculation of a maximum value, calculation of a numerical value corresponding to a specified order in an order related to a magnitude, fitting to a histogram, calculation of an average value, and calculation of a total sum.

A charged particle beam system according to another aspect of the disclosure includes: a charged particle beam apparatus; and a control system that analyzes an image obtained by the charged particle beam apparatus. The control system obtains a first coefficient by performing one of multiple resolution analysis, Fourier transform, and convolution calculation based on wavelet transform or discrete wavelet transform on at least a part of an image or a signal acquired by the charged particle beam apparatus, obtains a second coefficient by performing, on at least a part of the first coefficient or an absolute value of the first coefficient, any one of calculation of a maximum value, calculation of a numerical value corresponding to a specified order in an order related to a magnitude, fitting to a histogram, calculation of an average value, and calculation of a total sum, and obtains a third coefficient by obtaining any one of a product, a sum, and an average value obtained using the product or the sum for a plurality of the obtained second coefficients.

Advantageous Effect

According to an aspect of the disclosure, it is possible to appropriately evaluate a value of an adjustment parameter of a charged particle beam apparatus based on an image obtained by the charged particle beam apparatus.

BRIEF DESCRIPTION OF DRAWINGS

FIG. 1 schematically shows a basic configuration of a scanning electron microscope (SEM) system.

FIG. 2 schematically shows a basic configuration of a system used as a transmission electron microscope (TEM) or a scanning transmission electron microscope (STEM).

FIG. 3 is a flowchart of an example of a focus adjustment method.

FIG. 4A shows an example of an evaluation image.

FIG. 4B shows a horizontal wavelet transform image (1HL) and a vertical wavelet transform image (1LH) of a level 1 of the evaluation image shown in FIG. 4A.

FIG. 5 is a graph showing an example of a relationship between an objective lens current value and an evaluation value of the evaluation image.

FIG. 6A schematically shows the relationship between the objective lens current value and the evaluation value of the evaluation image at different levels.

FIG. 6B schematically shows a relationship between the objective lens current value and a new evaluation value obtained by a product of the objective lens current value and the evaluation value of the evaluation image at the different levels.

FIG. 7 is a flowchart showing an example of a method for determining an evaluation value of one evaluation image using a plurality of levels of wavelet transform images.

FIG. 8 is a flowchart showing an example of astigmatism correction.

FIG. 9 is a graph showing an example of a relationship between an astigmatism correction XY parameter pair and the evaluation value of the evaluation image.

FIG. 10 is a graph showing an example of a relationship among the objective lens current, the astigmatism correction XY parameter pair, and the evaluation value of the evaluation image.

FIG. 11 is a flowchart showing an example of a method for supporting apparatus adjustment by an operator.

FIG. 12A shows an example of an image displayed by a display device of a control system.

FIG. 12B shows another example of the image displayed by the display device of the control system.

FIG. 12C shows an example when comprehensive evaluation values are displayed in different forms on a screen.

FIG. 12D shows an example when the comprehensive evaluation values are displayed in different forms on the screen.

FIG. 12E shows an example when the comprehensive evaluation values are displayed on a screen with circular marks.

FIG. 12F shows an example when states of the astigmatism correction are displayed on the screen with the circular marks.

FIG. 12G shows an example when states of focus adjustment or the states of the astigmatism correction are displayed on the screen.

FIG. 13 is a flowchart showing a method for measuring a shape of a sample surface.

FIG. 14 shows an example when a height of each region of a sample is displayed on the screen based on a focusing condition in each local region.

FIG. 15A shows an example of an observation image.

FIG. 15B is a graph showing a histogram of absolute values of first coefficients obtained by performing a one-direction discrete wavelet transform on FIG. 15A.

FIG. 15C shows a result of fitting a function to the histogram of the coefficients shown in FIG. 15B.

DESCRIPTION OF EMBODIMENTS

Hereinafter, an embodiment will be described with reference to the accompanying drawings. The present embodiment is merely an example for implementing the disclosure, and does not limit the technical scope of the disclosure. In the drawings, the same components are denoted by the same reference numerals. In the following, an observation apparatus (electron microscope) of a sample using an electron beam is shown as an example of a charged particle beam apparatus, whereas the characteristics of the disclosure can also be applied to a measurement apparatus or an inspection apparatus in addition to an apparatus using an ion beam.

[System Configuration]

FIG. 1 schematically shows a basic configuration of a scanning electron microscope (SEM) system. The SEM system includes an SEM apparatus 50 and a control system 42. The SEM apparatus 50 is an example of the charged particle beam apparatus, and includes an electron source 1, an extraction electrode 2, a condenser lens 11, a condenser diaphragm 12, an axis adjustment deflector 13, an astigmatism correction device 14, a scan deflector 15, and an objective lens 20. In FIG. 1, only one condenser lens is indicated by the reference numeral 11 as an example.

The electron source 1 generates a primary electron beam. The condenser lens 11 adjusts a convergence condition of the primary electron beam. The condenser diaphragm 12 controls a spread angle of the primary electron beam. The axis adjustment deflector 13 adjusts an incident angle of the primary electron beam incident on a sample 21. The astigmatism correction device 14 adjusts a beam shape of the primary electron beam (probe) incident on the sample 21. The scan deflector 15 raster-scans the primary electron beam incident on the sample 21. The objective lens 20 adjusts a focal point position of the primary electron beam with respect to the sample 21.

The SEM apparatus 50 further includes a sample stage 22, a reflection plate 16, and a detector 26. The sample stage 22 determines a position of the sample 21 in a sample chamber. Electrons generated from the sample 21 or electrons generated by collision of the electrons from the sample 21 toward the reflection plate 16 are detected by the detector 26.

The control system 42 controls the SEM apparatus 50. For example, the control system 42 controls an acceleration voltage and an extraction voltage of the primary electron beam, and currents of components such as a lens and a deflector. The control system 42 can adjust an irradiation range and the incident angle of the primary electron beam to the sample 21 on the sample 21 by controlling the sample stage 22.

The control system 42 controls a gain and an offset of the detector 26, and generates an image based on a detected secondary electron beam. As will be described later, the control system 42 analyzes a plurality of images and calculates a predetermined evaluation score at a plurality of positions in each of the images. The control system 42 executes predetermined processing based on the calculated evaluation score.

The control system 42 includes a control device 40 and a computer 41. The computer 41 controls components of the SEM apparatus 50 through the control device 40. The computer 41 includes a storage device that stores a program and data used by the program, and a processor that operates in accordance with the program stored in the storage device. The program includes a control program and an image processing program of the SEM apparatus 50.

The computer 41 further includes an interface and a user interface for connection to a network. The user interface includes a display device that displays the image and an input device for the user to instruct the computer 41. The computer 41 controls the control device 40. The control device 40 includes components such as an AD converter, a DA converter, a memory, and a processor such as an FPGA.

Steps of obtaining an SEM image will be described. The extraction electrode 2 extracts the primary electron beam from the electron source 1 at a predetermined extraction voltage, and applies an acceleration voltage. A direction parallel to an optical axis is defined as a Z direction. A plane orthogonal to the optical axis is defined as an XY plane. The control system 42 adjusts the primary electron beam such that the primary electron beam converges on the sample 21 by adjusting a Z position of the sample stage 22 or adjusting a control parameter of the objective lens 20. The adjustment is rough adjustment.

After focal point rough adjustment, the control system 42 selects a field for adjustment of an electron optical system using an XY movement mechanism of the sample stage 22. The control system 42 corrects axial deviation, the focal point, and the astigmatism in the field for the adjustment of the electron optical system. Specifically, the control system 42 corrects adjustment parameters of the axis adjustment deflector 13, the astigmatism correction device 14, and the objective lens 20. Details of the correction of the focal point and the astigmatism will be described later. Next, the control system 42 moves to a field for capturing a image using the sample stage 22, finely adjusts the focal point of the objective lens 20 so that the image can be clearly observed, and then captures the image.

FIG. 2 schematically shows a basic configuration of a system used as a transmission electron microscope (TEM) or a scanning transmission electron microscope (STEM). In the following description, the STEM system will be described as a representative of both of the microscopes. The STEM system includes a STEM apparatus 51 and the control system 42. The STEM apparatus 51 includes the electron source 1, the extraction electrode 2, the condenser lens 11, the condenser diaphragm 12, the axis adjustment deflector 13, the astigmatism correction device 14, the scan deflector 15, the objective lens 20, and the sample stage 22. In FIG. 2, only one condenser lens is indicated by the reference numeral 11 as an example. These functions are the same as those of the SEM apparatus 50.

The STEM apparatus 51 includes, on a rear side of the sample 21, an objective diaphragm 23, an axis adjustment deflector 24, a limited field diaphragm 25, an imaging system lens 30, and a detector 31. In FIG. 2, only one imaging system lens is indicated by the reference numeral 30 as an example, whereas the imaging system lens is not necessarily required to obtain the functions of the STEM. The imaging system lens 30 forms an image of a transmitted electron beam that passes through the sample 21. The detector 31 detects the image-formed electron beam.

The control system 42 generates an image based on the detected secondary electron beam. As will be described later, the control system 42 analyzes the plurality of images and calculates the predetermined evaluation score at the plurality of positions in each of the images. The control system 42 executes the predetermined processing based on the calculated evaluation score.

Similar to the SEM system, the control system 42 includes the control device 40 and the computer 41. Programs executed by the computer 41 include a control program and an image processing program of the STEM apparatus 51.

Steps for obtaining an STEM image will be described. The extraction electrode 2 extracts the primary electron beam from the electron source 1 at the predetermined extraction voltage, and applies the acceleration voltage. The control system 42 causes the primary electron beam to be incident on a thin film sample 21 on the sample stage 22.

The control system 42 performs the focal point rough adjustment of the primary electron beam by adjusting the Z position of the sample stage 22 or adjusting the control parameter of the objective lens 20. Thereafter, the control system 42 selects the field for adjustment of the electron optical system using the XY movement mechanism of the sample stage 22. The control system 42 corrects the axial deviation, the focal point, and the astigmatism in the field for the adjustment of the electron optical system. Specifically, the control system 42 corrects the adjustment parameters of the axis adjustment deflector 13, the astigmatism correction device 14, and the objective lens 20. Details of the correction of the focal point and the astigmatism will be described later.

The control system 42 uses the condenser lens 11, the axis adjustment deflector 13, and the astigmatism correction device 14 to cause the primary electron beam to be perpendicularly incident on the sample 21 at an incident angle parallel to the Z axis. The control system 42 causes the scan deflector 15 to perform scanning with the primary electron beam. When the primary electron beam is incident on the thin film sample 21, most of the electrons pass through the sample 21. The imaging system lens 30 causes the transmitted electron beam to be incident on the detector 31 at an appropriate angle, and the STEM image is obtained. Magnification of the STEM image is set by a current for controlling the scan deflector 15.

[Focus Adjustment]

Hereinafter, a method of determining target values of the adjustment parameters of the SEM apparatus 50 or the STEM apparatus 51 based on image analysis and an image analysis result by the SEM apparatus 50 or the STEM apparatus 51 will be described. The adjustment parameters include various parameters (various aberrations, the axis of the primary electron beam, a potential of the lens, a bias potential to the sample, and the like) that affect a size of a diameter and a shape of the probe (the primary electron beam with which the sample is irradiated) in addition to the focus and the astigmatism.

The focus and the astigmatism will be described below as examples of the adjustment parameters. As described with reference to FIGS. 1 and 2, (a position of) the focus is controlled by a current of the objective lens 20. The current of the objective lens 20 is an adjustment parameter corresponding to the focus. By adjusting the objective lens current, the diameter of the probe can be reduced.

The astigmatism is controlled (corrected) by the current of the astigmatism correction device 14. Specifically, the astigmatism correction device 14 has, in many cases, two adjustment parameters which are an X parameter and a Y parameter. The astigmatism correction device 14 includes a plurality of coils. The X parameter indicates a current value of a part of the coils. The Y parameter indicates a current value of the other part of the coils. Based on the X and Y parameters, the shape of the probe can be brought close to a perfect circle.

FIG. 3 is a flowchart showing an example of a focus adjustment method. The control system 42 sets the current value of the objective lens 20 to a start value corresponding to a current value corresponding to an end of a focus search range, which is assumed based on a physical configuration of the apparatus, a past operation history, or the like (S101). The control system 42 acquires an observation image (evaluation image) of the sample 21, and stores the observation image in the storage device together with a present current value of the objective lens 20 (S102). The control system 42 calculates an evaluation value of the observation image (S103). The evaluation value represents steepness of intensity change of the image with respect to vertical/horizontal directions (vertical and horizontal directions) included in the image. The evaluation value becomes higher as a structure with respect to each of the vertical/horizontal directions in the observed image becomes finer. A method for calculating the evaluation value will be described later.

The control system 42 determines whether the present current value of the objective lens 20 satisfies an end condition (S104). As the end condition at this time, a condition that the objective lens current value is equal to an end value determined by a present evaluation condition, a condition that the objective lens current value is equal to or less than the end value when a change amount of the current value in S105 is negative, a condition that the objective lens current value is equal to or more than the end value when the change amount of the current value in S105 is positive, or the like can be used. When the present current value of the objective lens 20 does not satisfy the end condition (S104: NO), the control system 42 changes the current value of the objective lens 20 by a predetermined value (S105). Further, the control system 42 returns to step S102.

When the present current value of the objective lens 20 is the end value (S104: YES), the control system 42 determines a relationship between the current value of the objective lens 20 stored in the storage device and the evaluation value (S106). For example, the control system 42 determines the relationship between the current value of the objective lens 20 and the evaluation value by a fitting function set in advance, and determines an optimum condition by interpolation. The fitting function is, for example, Gaussian or a polynomial expression.

The control system 42 determines the current value of the objective lens 20 at which the evaluation value is the maximum based on the relationship between the current value of the objective lens 20 and the evaluation value determined in step S106 (S107). The evaluation value substantially indicates information related to a spatial spread of probes on the sample. A large evaluation value indicates that the probes are concentrated in a narrow region on the sample and become thinner. The large evaluation value also indicates that a distance between a plane on which the probes converge and an interest point on the sample is short. Accordingly, the objective lens current value at which the evaluation value is the maximum is an optimum current value.

The control system 42 determines whether an evaluation result (the optimum current value and the evaluation value thereof) satisfies a predetermined criterion (S108). The criterion at this time is, for example, that the change amount per one time of the objective lens current value in an immediately preceding series of image acquisition is equal to or less than a current amount corresponding to target adjustment accuracy, or whether the maximum evaluation value obtained in the immediately preceding image evaluation exceeds a criterion value determined based on performance or capturing magnification of the charged particle beam apparatus. When the evaluation result does not satisfy the predetermined criterion (S108: NO), the control system 42 calculates a new evaluation condition (S109), and returns to step S101. When the evaluation result satisfies the predetermined criterion (S108: YES), the control system 42 sets the current value of the objective lens 20 to the above optimum objective lens current value (S110).

As another embodiment, in the series of flows described above, the calculation of the evaluation value of the observation image (S103) may be executed at any timing before step S106 is executed. The same effect can be attained by executing step S104 after step S102, and then executing step S102 collectively for each image immediately before step S106 is executed.

Alternatively, by executing calculation in parallel with each piece of processing, step S104 can be executed after step S103 is executed without waiting for the completion of step S103. In this case, the same effect can be attained as long as it is checked that all calculations executed in step S102 are completed before step S106 is executed.

A method of calculating the evaluation value will be described. In one example, the control system 42 calculates the evaluation value based on a wavelet transform coefficient. Since Fourier transform expresses a signal by superimposition of periodic waves, position information is lost. On the other hand, in the wavelet transform, the image is transformed into a superimposed wavelet (localized small waves/bases) by changing a scale and a position. Therefore, it is possible to evaluate local frequency information while maintaining the position information of the image.

The wavelet transform will be described. It is assumed that a scaling function $\varphi(x)$ and a wavelet function $\psi(x)$ satisfy a Two Scale relationship shown below.

$$\phi(x) = \sum_k p_k \phi(2x - k) \qquad \text{[Formula 1]}$$

$$\psi(x) = \sum_k q_k \phi(2x - k)$$

Any function $f_j(x)$ can be decomposed into two functions as shown below.

$$f_j(x) = \sum_k w^{(j)}(k) 2^{\frac{j}{2}} \psi(2^j x - k) + \sum_k s^{(j)}(k) 2^{\frac{j}{2}} \phi(2^j x - k) \qquad \text{[Formula 2]}$$

$$= \sum_k w^{(j)}(k) \psi_{j,k}(x) + \sum_k s^{(j)}(k) \phi_{j,k}(x)$$

$$= g_{j-1}(x) + f_{j-1}(x)$$

Here, j is a level of the wavelet transform, $s^{(j)}$ is a scaling coefficient of the level j, and $w^{(j)}$ is a wavelet coefficient of the level j. $s^{(j)}$ and $w^{(j)}$ are represented as follows.

$$s^{(j)}(n) = \sum_k p_k s_k^{(j-1)}(2n - k) \qquad \text{[Formula 3]}$$

$$w^{(j)}(n) = \sum_k q_k w_k^{(j-1)}(2n - k)$$

Here, $p_k$ is a scaling filter and $q_k$ is a wavelet filter, which have a known relationship as an orthogonal mirror filter. A plurality of filters that satisfy one of the following conditions are known. Typical examples thereof include those based on Daubechie. As an example, a Daubechie wavelet is shown below.

$$q = \left( \frac{1 - \sqrt{3}}{4\sqrt{2}}, \frac{-3 + \sqrt{3}}{4\sqrt{2}}, \frac{3 + \sqrt{3}}{4\sqrt{2}}, \frac{-1 - \sqrt{3}}{4\sqrt{2}} \right) \qquad \text{[Formula 4]}$$

$$p = \left( \frac{1 + \sqrt{3}}{4\sqrt{2}}, \frac{3 + \sqrt{3}}{4\sqrt{2}}, \frac{3 - \sqrt{3}}{4\sqrt{2}}, \frac{1 - \sqrt{3}}{4\sqrt{2}} \right)$$

Since $p_k$ acts as a low-pass filter and $q_k$ acts as a high-pass filter, the coefficients $s^{(j)}$ and $w^{(j)}$ obtained by expanding the function $f_j(x)$ correspond to a low-frequency component and a high-frequency component of $f_j(x)$, respectively. Further, by applying the filters $p_k$ and $q_k$ to $s^{(j)}$ again, $s^{(j+1)}$ and $w^{(j+1)}$ are obtained. By repeating this, $f_j(x)$ can be expanded in the following form.

$$f_j(x) = g_{j-1}(x) + g_{j-2}(x) + \ldots + g_{j-m}(x) + f_{j-m}(x) \qquad \text{[Formula 5]}$$

Each component of the obtained g(x) corresponds to a frequency component having a period in which resolution is twice as different. The above is multiple resolution analysis based on the discrete wavelet transform. An example in which the multiple resolution analysis based on the discrete wavelet transform is applied to a two-dimensional array f(m,n) will be described below. When f(m,n) is regarded as a scaling function $s^{(0)}(m,n)$ of level 0, transform along an m axis is represented as follows.

$$s^{(j+1,x)}(m, n) = \sum_k p_{k,m} s^{(j)}(k, n)$$ [Formula 6]

$$w^{(j+1,x)}(m, n) = \sum_k q_{k,m} s^{(j)}(k, n)$$

Further, the obtained $s^{(j+1,x)}(m,n)$ and $w^{(j+1,x)}(m,n)$ are transformed along an n axis to obtain the following four components.

$$s^{(j+1)}(m, n) = \sum_l p_{l,n} s^{(j+1,x)}(m, l)$$ [Formula 7]

$$w^{(j+1,h)}(m, n) = \sum_l q_{l,n} s^{(j+1,x)}(m, l)$$

$$w^{(j+1,v)}(m, n) = \sum_l p_{l,n} w^{(j+1,x)}(m, l)$$

$$w^{(j+1,d)}(m, n) = \sum_l q_{l,n} w^{(j+1,x)}(m, l)$$

The four components are represented as follows.

$$s^{(j+1)}(m, n) = \sum_l \sum_k p_{k,m} p_{l,n} s^{(j)}(k, l)$$ [Formula 8]

$$w^{(j+1,h)}(m, n) = \sum_l \sum_k p_{k,m} q_{l,n} s^{(j)}(k, l)$$

$$w^{(j+1,v)}(m, n) = \sum_l \sum_k q_{k,m} p_{l,n} s^{(j)}(k, l)$$

$$w^{(j+1,d)}(m, n) = \sum_l \sum_k q_{k,m} q_{l,n} s^{(j)}(k, l)$$

$s^{(j+1)}(m,n)$ is a low-frequency component of $s^{(j)}(m,n)$. $w^{(j+1,h)}(m,n)$ is a high-frequency component in a direction (horizontal direction) along the m axis. $w^{(j+1,v)}(m,n)$ is a high-frequency component in a direction (vertical direction) along the n axis. $w^{(j+1,d)}(m,n)$ is a high-frequency component in a diagonal direction.

The control system 42 determines the evaluation value at each position based on $w^{(j+1,h)}(m,n)$ and/or $w^{(j+1,v)}(m,n)$. FIG. 4A shows an example of the evaluation image 400. FIG. 4B shows a horizontal wavelet transform image (1HL) 401 and a vertical wavelet transform image (1LH) 402 of level 1 of the evaluation image shown in FIG. 4A.

The horizontal wavelet transform image 401 is an image formed of $w^{(1,h)}(m,n)$, and indicates the high-frequency component (change in the image) of the evaluation image 400 in the horizontal direction. The vertical wavelet transform image 402 is an image formed of $w^{(1,v)}(m,n)$, and indicates the high-frequency component (change in the image) of the evaluation image 400 in the vertical direction. In the horizontal wavelet transform image (1HL) 401 and the vertical wavelet transform image (1LH) 402, a change from a bright region to a dark region is indicated by a bright line. The larger the change, the brighter the line is (closer to white). The change from the dark region to the bright region is indicated by a dark line. The larger the change, the darker the line is (closer to black).

As described above, it is possible to obtain a horizontal wavelet transform image ((j+2)HL) and a vertical wavelet transform image ((j+2)LH) of a level j+2 by the wavelet transform of a low-frequency component image ((j+1)LL) of a level j+1. An image of a higher level indicates information of a lower spatial frequency (resolution).

In particular, when attention is focused on a local region including a structure such as an edge in the sample, if the focus is on the sample, the intensity change of the image in the region becomes steep, and an absolute value of the wavelet transform coefficient becomes large. Conversely, if the focus is deviated from the sample, in order to obtain the intensity of the image using information in a region wider than the condition when the focus is on the sample, as a result, the intensity change of the image in the region becomes relatively gradual, and the absolute value of the wavelet transform coefficient becomes small. Therefore, a large absolute value of the wavelet transform coefficient indicates that the focus is on the sample.

In one example, the control system 42 determines the evaluation value of the evaluation image based on the horizontal wavelet transform coefficient and/or the vertical wavelet transform coefficient of one specific level j+1. For example, the control system 42 determines a maximum value of the absolute value of the horizontal wavelet transform coefficient of the level j+1 (for example, level 1) as a horizontal evaluation value of the evaluation image, and determines a maximum value of the absolute value of the vertical wavelet transform coefficient of the level j+1 as the vertical evaluation value of the evaluation image. The control system 42 determines a comprehensive evaluation value of the evaluation image using the horizontal evaluation value and the vertical evaluation value. As the comprehensive evaluation value, the horizontal evaluation value or the vertical evaluation value can be used as it is. However, when the sample mainly has a change in structure only in one direction, or when the astigmatism deviates from an optimum condition, it is desirable to obtain the comprehensive evaluation value using both the horizontal evaluation value and the vertical evaluation value in order to obtain the optimum condition. As a representative example, a product of the horizontal evaluation value and the vertical evaluation value is determined as the comprehensive evaluation value of the evaluation image.

The product of the horizontal evaluation value and the vertical evaluation value can be used as an index that comprehensively represents the fineness of the structure in both the vertical and horizontal directions in the evaluation image. The maximum value of the absolute value of the wavelet transform coefficient may be determined for data from which noise is removed or an image to which information restoration processing is applied using a technique such as a neural network or compressed sensing. A plurality of algorithms are known as a method for obtaining the wavelet transform coefficient, whereas the invention is not limited to these types.

As the evaluation value of the evaluation image, other values can be used. For example, the horizontal evaluation value, the vertical evaluation value, or a value obtained by a sum, a geometric average, an additive average, or the like of the horizontal evaluation value and the vertical evaluation value can be used. The control system 42 calculates only a value necessary for determining the evaluation value of the evaluation image among the horizontal evaluation value and the vertical evaluation value.

As described with reference to the flowchart in FIG. 3, the control system 42 acquires the image of the sample 21 at different focus positions (objective lens current values). The image is the evaluation image.

FIG. 5 is a graph showing an example of the relationship between the objective lens current value and the evaluation value of the evaluation image. Points in the graph indicate the objective lens current values of the evaluation image and the evaluation values calculated based on the wavelet coefficient. The curve is a Gaussian (fitting function) fitted to the evaluation values (points) of the evaluation image. The control system 42 specifies the objective lens current value corresponding to the maximum evaluation value in the fitted Gaussian, and determines the objective lens current value as an optimum focus current value (optimum objective current value).

By using the fitting function, an appropriate objective lens current value can be determined based on a small number of evaluation images. In another example, the control system 42 may determine the objective lens current value corresponding to the maximum evaluation value among evaluation values of a microscopic image as the optimum objective current value.

The level at which the evaluation value is calculated may be set in advance. In another example, the control system 42 may analyze a plurality of levels of the evaluation images and select an optimum level based on an analysis result thereof.

As described above, the spatial frequency corresponding to the wavelet transform image is different depending on the level of the wavelet transform. Specifically, the image of a higher level indicates the information of a lower spatial frequency (resolution). The level at which the characteristics of the structure of the sample 21 most easily appear depends on the structure, the type of the wavelet to be used, or both. By analyzing the plurality of levels of evaluation images and selecting the level based on the analysis result thereof, more appropriate evaluation can be performed.

FIG. 6A schematically shows the relationship between the objective lens current value and the evaluation value of the evaluation image at different levels. Graphs 501, 502, and 503 show the relationship between the objective lens current value and the evaluation value of the evaluation image determined based on the wavelet transform coefficient at the level 1, the level 2, and the level 3, respectively. Points in the graphs 501, 502, and 503 indicate the objective lens current values and the evaluation value, calculated based on the wavelet coefficient, of the evaluation image. Curves are Gaussians (fitting functions) having a positive offset which is fitted to the evaluation values (points) of the evaluation image.

In the example shown in FIG. 6A, errors between the fitting functions of the level 1 and the level 2 and the evaluation values of the evaluation images are small, and the error between the fitting function of the level 3 and the evaluation value of the evaluation image is large.

For example, the control system 42 may select a level most suitable for evaluation from a plurality of levels of wavelet transform coefficients. As described above, the level at which the characteristics of the structure of the sample 21 most easily appear is generally unknown before the image analysis. By using the plurality of levels of wavelet transform coefficients, performing the evaluation at each level, and evaluating a behavior of the score with respect to the objective lens current value, it is possible to calculate the evaluation value using the coefficient at the level at which the characteristics of the structure of the sample 21 most easily appear.

As an example, the control system 42 can select a level with the smallest error between the evaluation value of the evaluation image and the fitted function. The error can be represented by, for example, a sum of a distance between the fitting function and the evaluation value of the evaluation image, or a sum of squares of the distance. As another example, the control system 42 can evaluate an appropriate level based on the value of the fitting error of each parameter of the Gaussian obtained by the fitting, the height of the Gaussian obtained by the fitting, or the like.

A graph 504 shown in FIG. 6B shows the relationship between an evaluation value obtained by a product of the evaluation values obtained at the levels shown in the graphs 501, 502, and 503 and the objective lens current value. As described above, since the level at which the characteristics of the structure of the sample 21 most easily appear is limited to a part of the levels, the evaluation values of other levels are not likely to change with respect to the change of the objective lens current value.

Therefore, the product of the evaluation values obtained at the plurality of levels is dominated by the change in the evaluation value at the level at which the characteristics of the structure of the sample 21 most easily appear. Therefore, the product also has the characteristics that the evaluation value becomes large near the condition when the focus is on the sample. By using the evaluation value obtained in this manner, it is not necessary to select the level with the appropriate evaluation value in accordance with the sample or the magnification, and it is possible to evaluate various sample structures or magnifications using a single index at all times. In obtaining a new evaluation value based on the product of the plurality of levels of evaluation values, it is not always necessary to use all obtained levels of evaluation values, and it is also possible to obtain and use the product using only some appropriate levels of evaluation values.

FIG. 7 is a flowchart showing an example of a method for determining the evaluation value of one evaluation image using the plurality of levels of wavelet transform images (transform coefficients). The control system 42 acquires the evaluation image 400 (observation image) from the storage device, and performs two-dimensional discrete wavelet transform (S151). Accordingly, four level-1-wavelet-transform images are obtained, which are a transform image 411 of 1HL component, a transform image 412 of 1LH component, a transform image 413 of 1HH component, and a transform image 414 of 1LL component. An example of the transform image 411 of the 1HL component and the transform image 412 of the 1HL component is shown in FIG. 4B.

The control system 42 selects the maximum value of the absolute values of the wavelet transform coefficients in the transform image 411 of the 1HL component (S152), and obtains a horizontal evaluation value 511 of level 1. The control system 42 selects the maximum value of the absolute values of the wavelet transform coefficients in the transform image 412 of the 1LH component (S153), and obtains a vertical evaluation value 512 of level 1. The control system 42 calculates the product of the horizontal evaluation value 511 and the vertical evaluation value 512 (S154), and determines an evaluation value (L1 vertical and horizontal evaluation value) 513 of the evaluation image of level 1. The calculation of the evaluation value 513 of the evaluation image may be any of the above-described examples.

The control system 42 performs the two-dimensional discrete wavelet transform of the transform image 414 of the LL component of level 1 (S155). Accordingly, four level-2-wavelet-transform images are obtained, which are a transform image 421 of 2HL component, a transform image 422 of 2LH component, a transform image 423 of 2HH component, and a transform image 424 of 2LL component.

The control system 42 selects the maximum value of the absolute values of the wavelet transform coefficients in the transform image 421 of the 2HL component (S156), and obtains a horizontal evaluation value 521 of level 2. The control system 42 selects the maximum value of the absolute values of the wavelet transform coefficients in the transform image 422 of the 2LH component (S157), and obtains a vertical evaluation value 522 of level 2. The control system 42 calculates the product of the horizontal evaluation value 521 and the vertical evaluation value 522 (S158), and determines an evaluation value (L2 vertical and horizontal evaluation value) 523 of the evaluation image of level 2. The method for calculating the evaluation value 523 of the evaluation image is the same as or different from that for calculating the evaluation value 513.

The control system 42 repeats the calculation of the evaluation value up to a level N set in advance (S159). Accordingly, evaluation values 513 to 5N3 of level 1 to level N are obtained. The control system 42 calculates the product of the evaluation values 513 to 5N3 of all the levels (S160), and obtains a comprehensive evaluation value 540 of the evaluation image 400. The comprehensive evaluation value 540 is an evaluation value corresponding to the objective lens current value, the astigmatism correction amount, and other adjustment parameters of the charged particle beam apparatus for capturing the evaluation image.

As described above, variation of the vertical and horizontal evaluation values in the wavelet transform image of the level from which the characteristics of the evaluation image 400 are not extracted is small, and the variation of the vertical and horizontal evaluation values in the wavelet transform image of the level from which the characteristics of the evaluation image 400 are extracted is large. When the product of the plurality of levels of evaluation values is used as the comprehensive evaluation value of the image, the comprehensive evaluation value mainly depends on the change in the evaluation value of the level from which the characteristics of the evaluation image 400 are extracted. Therefore, the comprehensive evaluation value is suitable as the index for evaluating the steepness of the intensity change with respect to each of the vertical and horizontal directions of the evaluation image. As the comprehensive evaluation value 540, other methods, for example, a sum, a geometric average, and an additive average of the plurality of levels of evaluation values may be used.

[Astigmatism Correction]

Next, an astigmatism correction (adjustment) method based on the evaluation value of the evaluation image will be described. FIG. 8 is a flowchart showing an example of the astigmatism correction. The control system 42 creates a table A of a pair (condition) of the astigmatism correction X parameter and the astigmatism correction Y parameter that are to be evaluated (S201). The table A includes a plurality of different pairs.

Here, as the table A, it is possible to use a table in which the astigmatism correction X parameter is set to the same value and only the astigmatism correction Y parameter is set to a plurality of values, a table in which the astigmatism correction Y parameter is set to the same value and only the astigmatism correction X parameter is set to a plurality of values, a table in which each of the astigmatism correction X and Y parameters is set to a plurality of values and the values are combined with one another, or the like.

The control system 42 sets the values of the astigmatism correction X and Y parameters of the astigmatism correction device 14 to a first pair in the table A (S202). The control system 42 acquires an observation image from the SEM apparatus 50 or the STEM apparatus 51, and stores the observation image in the storage device together with the values of the astigmatism correction X and Y parameters (S203).

The control system 42 calculates an evaluation value of the observation image (S204). As a method for calculating the evaluation value, any one of the methods described in the focus adjustment can be used. The method for calculating the evaluation value of the focus adjustment and the method for calculating the evaluation value of the astigmatism correction are the same or different. The control system 42 determines whether the measurement is performed for all pairs in the table A (S205). When the table A includes an unmeasured pair (S205: NO), the control system 42 sets the values of the astigmatism correction X parameter and the astigmatism correction Y parameter of the astigmatism correction device 14 to a next unmeasured pair in the table A (S206).

When the measurement is performed for all the pairs in the table A (S205: YES), the control system 42 determines a relationship between the values of the astigmatism correction X parameter and the astigmatism correction Y parameter that are stored in the storage device and the evaluation value (S207). For example, the control system 42 determines the relationship between the evaluation value and the values of the astigmatism correction X parameter and the astigmatism correction Y parameter using the fitting function set in advance. The fitting function is, for example, a two-dimensional Gaussian or a two-variable polynomial expression.

The control system 42 determines the values of the astigmatism correction X parameter and the astigmatism correction Y parameter based on the relationship between the evaluation value and the values of the astigmatism correction X parameter and the astigmatism correction Y parameter determined in step S207 (S208). As another example, it is also possible to directly determine the values of the astigmatism correction X parameter and the astigmatism correction Y parameter (S208) by performing interpolation or measurement of a center of gravity by Lagrange compensation, Hermitian compensation, spline compensation, or the like on the values of the astigmatism correction X parameter and the astigmatism correction Y parameter that are stored in the storage device and the value of the evaluation value without performing the processing of obtaining the relationship between the values of the astigmatism correction parameters and the evaluation value (S207).

In a state in which the sample is in focus, when an optimum condition in which the astigmatism is adjusted with respect to both X/Y parameters is used as a criterion, and any one of the X/Y parameters changes from the criterion, the shape of the probe extends only in one direction corresponding to the parameter. As a result, the fineness of the image with respect to the direction decreases, and thus the evaluation value decreases.

Since the shape of the probe under the optimum condition is basically circular (isotropic), the evaluation value represents anisotropy of the probe shape as a result, and the magnitude of the evaluation value has a negative correlation with respect to the spatial spread of the probe on the sample. When only components of the astigmatism twice symmetrical to the focus are considered as the adjustment parameters, the condition under which the spread of the probe is minimized in both the vertical direction and the horizontal direction is a state in which both the parameters are 0, that is, the focus is achieved and the astigmatism is corrected, and the evaluation value is maximized at this time.

Therefore, the values of the objective lens current amount, the astigmatism correction X parameter, and the astigmatism correction Y parameter under the condition in which the evaluation value is maximized are optimum parameter values. When the adjustment is performed in the focused state, the values of the astigmatism correction X parameter and the astigmatism correction Y parameter under the condition in which the evaluation value is maximized are an optimum parameter value pair.

The control system 42 determines whether the evaluation result (the optimum parameter value pair and the evaluation value thereof) satisfies a predetermined criterion (S209). As the criterion at this time, it is possible to use a result obtained by comparing the magnitude of a variation amount of the astigmatism correction X and Y parameters in the table A used at the time of the immediately preceding image acquisition, that is, accuracy of the evaluation estimated from the fineness of the condition used for the evaluation with a predetermined criterion value. Alternatively, it is possible to use a result obtained by comparing an error amount of the fitting obtained at the time of the fitting in the step of determining the relationship between the values of the astigmatism correction X parameter and the astigmatism correction Y parameter and the evaluation value with the predetermined criterion value, or the like.

When the evaluation result does not satisfy the predetermined criterion (S209: NO), the control system 42 creates a pair table A of the astigmatism correction X parameter and the astigmatism correction Y parameter to be newly evaluated (S210), and returns to step S202. When the evaluation result satisfies the predetermined criterion (S209: YES), the control system 42 sets the astigmatism correction X parameter and the astigmatism correction Y parameter of the astigmatism correction device 14 to the above optimum parameter value pair (S211).

As another embodiment, in the series of flows described above, the calculation of the evaluation value of the observation image (S204) may be executed at any timing before step S207 is executed. The same effect can be attained by executing step S205 after step S203, and then executing step S204 collectively for each image immediately before step S207 is executed.

Alternatively, by executing calculation in parallel with each piece of processing, step S205 can be executed after step S204 is executed without waiting for the completion of step S204. In this case, the same effect can be attained as long as it is checked that all calculations executed in step S204 are completed before step S207 is executed.

The astigmatism adjustment described above may be performed on only one of the astigmatism correction X and Y parameters. In this case, one of the parameters is fixed to a value at the start of adjustment, some initial values or criterion values, and a plurality of values are set only for the other parameter, thereby creating the table A in S201 and S210.

The determination of the relationship between the values of the astigmatism correction parameters and the evaluation value in (S207) is performed only for one of the astigmatism correction X and Y parameters. As the function used for fitting at that time, a one-dimensional Gaussian, a one-variable polynomial expression, interpolation using an interpolation function, a value of the obtained center of gravity, or the like can be used. Other processing is executed in the same way as a case when both the X and Y parameters are adjusted.

The pair of X and Y parameters constituting the table A created in S201 and S210 may be a condition for being arranged on a straight line in the two-dimensional space formed by both the X and Y parameters. In this case, the result obtained by the adjustment corresponds to obtaining the optimum condition on a single vector axis in the two-dimensional space described above.

FIG. 9 is a graph showing an example of the relationship between the astigmatism correction XY parameter pair and the evaluation value of the evaluation image. Points in the graph indicate astigmatism correction XY parameter value pairs of the evaluation image and the calculated evaluation values. Curves are fitting functions (obtained by adding an offset to a two-dimensional Gaussian) fitted to the evaluation values (points) of the evaluation image.

The control system 42 specifies the astigmatism correction XY parameter value pair corresponding to the maximum evaluation value in the fitted fitting function, and determines the astigmatism correction XY parameter value pair as the optimum astigmatism correction XY parameter value pair with the smallest astigmatism.

By using the fitting function, an appropriate astigmatism correction XY parameter value pair can be determined based on a small number of evaluation images. In another example, the control system 42 may determine the astigmatism correction XY parameter value pair corresponding to the maximum evaluation value, an average value obtained based on the maximum evaluation value and the evaluation value of the condition that is close to the condition corresponding to the maximum evaluation value in the parameter space, the center of gravity obtained based on a plurality of parameter conditions and the evaluation values thereof, or the maximum value obtained by interpolation as the optimum objective current value without using the fitting function.

The control system 42 may perform the focus adjustment after or before performing the astigmatism correction. For example, the control system 42 performs the astigmatism correction to determine the optimum astigmatism correction XY parameter value pair. The control system 42 sets the astigmatism correction device 14 as the optimum astigmatism correction XY parameter value pair and performs the focus adjustment.

The control system 42 may alternately and repeatedly perform the astigmatism correction and the focus adjustment. In the astigmatism correction, the control system 42 sets the SEM apparatus 50 or the STEM apparatus 51 to the optimum condition determined in the immediately preceding focus adjustment. In the focus adjustment, the control system 42 sets the SEM apparatus 50 or the STEM apparatus 51 to the optimum condition determined in the immediately preceding astigmatism correction. The number of times of the astigmatism correction and the focus adjustment depends on the design, observation conditions, target adjustment accuracy, and the state of the apparatus at the time of starting the adjustment.

In the astigmatism correction, the control system 42 may alternately perform the adjustment for one of the astigmatism correction XY parameters and the adjustment for the other parameter by any number of times or may repeatedly perform the adjustment in any order. Further, in the astigmatism correction, the control system 42 may repeatedly perform the adjustment for one of the astigmatism correction XY parameters, the adjustment for the other parameter, and the focus adjustment for any number of times in any order.

As an example, after performing the focus adjustment, the control system 42 performs the adjustment on any one of the astigmatism correction XY parameters in the astigmatism correction, then performs the adjustment on the other parameter, and then performs the focus adjustment again. Accordingly, the number of evaluation conditions used in each adjustment can be reduced, and the time required to complete the adjustment can be shortened.

In another example, the control system 42 may simultaneously perform the astigmatism correction and the focus adjustment. Accordingly, effects such as improvement in the adjustment accuracy, reduction in chance of failure in adjustment, and reduction in adjustment time can be attained. The control system 42 captures an image (observation image) of a different astigmatism correction XY parameter value pair for each of the different objective lens current values, and stores the image in the storage device together with the objective lens current value and the astigmatism correction XY parameter value pair.

The control system 42 calculates the evaluation value of each observation image (evaluation image) in the storage device. FIG. 10 is a graph showing an example of the relationship among the objective lens current, the astigmatism correction XY parameter pair and the evaluation value of the evaluation image. Sizes of circles in the graph indicate the evaluation values. The larger the circle is, the higher the evaluation value is.

The control system 42 determines the relationship between the evaluation value and the combination of the objective lens current value and the astigmatism correction XY parameter value pair based on a fitting function set in advance. The fitting function is, for example, a three-dimensional Gaussian or a three-variable polynomial expression. The control system 42 gives a maximum value of the evaluation value indicated by the fitted function, and a combination of the objective lens current value and the astigmatism correction XY parameter value pair corresponding to the maximum value, and determines the maximum value and the combination as the optimum condition. The control system 42 may determine, as the optimum condition, the combination of the objective lens current value and the astigmatism correction XY parameter value pair that correspond to the maximum evaluation value, an average condition for a plurality of conditions that is close to the condition corresponding to the maximum evaluation value, or a condition corresponding to the center of gravity without using the fitting function.

In the above example, the control system 42 acquires the evaluation images under a plurality of predetermined setting conditions, then determines the optimum condition based on these evaluation values, and sets the SEM apparatus 50 or the STEM apparatus 51 to the condition. Unlike this, the control system 42 may determine a condition for acquiring the observation image for adjustment next after evaluating the observation image under a specific condition.

As a specific example, when the change amount of the evaluation value with respect to the change of the immediately preceding parameter value is smaller than a typical value, the parameter value is changed largely as the condition for acquiring the observation image for adjustment next. Conversely, when the change amount of the evaluation value is large, the parameter value is changed small as the condition for acquiring the observation image for adjustment next. Accordingly, an evaluation system can be improved by reducing the number of image acquisitions under a condition in which the change in the image is small, such as a condition largely deviated from the optimum condition, to shorten the evaluation time, and by increasing the number of image acquisitions near the optimum condition in which the image is likely to change.

In the two-dimensional space constituted by two parameters which are the astigmatism correction X parameter and the astigmatism correction Y parameter, the three-dimensional space constituted by the focus adjustment parameters including the astigmatism correction X parameter, the astigmatism correction Y parameter, and the objective lens current value, or the one-dimensional space constituted by the focus adjustment parameter including the objective lens current value, it is also possible to efficiently obtain the optimum condition using various generally known algorithms for solving an optimization problem such as a steepest descent method or a conjugate gradient method. In this case, a method of using reciprocal of the evaluation value as a new evaluation value can be used in combination.

The control system 42 may acquire the evaluation image for one condition including three values which are the objective lens current value and the astigmatism correction XY parameters, obtain the evaluation value, compare the evaluation value with some immediately preceding evaluation results or all the evaluation results up to that point, obtain a condition in which the evaluation value is expected to be larger, and set the condition as the next evaluation condition.

As an example, an evaluation image may be acquired for four independent conditions, an evaluation value may be obtained, a gradient of the evaluation value in the three-dimensional space constituted by three parameters which are the objective lens current value and the astigmatism correction XY parameters, which is obtained based on a difference between each condition and the evaluation value, may be obtained, and a point having a largest gradient and advanced by a certain distance in a direction in which the change in the evaluation value is positive may be set as a new observation condition.

Alternatively, the new evaluation condition may be obtained by acquiring an evaluation image for two or more independent conditions, obtaining an evaluation value, and performing the interpolation in the three-dimensional space constituted by the objective lens current value and the astigmatism correction XY parameters.

An example of the focus adjustment will be described. The control system 42 acquires the observation images having the plurality of objective lens current values. As the plurality of objective lens current values used at this time, the present current value or the objective lens current value before and after the objective lens current value expected to be in focus on the sample is used. The objective lens current value expected to be in focus on the sample is, for example, a current value focused when the sample is placed at a standard position for an apparatus.

As an example, in an apparatus in which the sample position that is in focus when the objective lens current value is 6.5 A is the standard sample position, the control system 42 selects six objective current values at 0.2 A intervals in a range from 6 A to 7 A. The control system 42 determines the evaluation value of each of the observation images and determines the objective lens current value at which the evaluation value is the maximum. Although the objective lens current value used in defining the standard sample position described above varies greatly depending on the acceleration voltage of the apparatus, at that time, the image is acquired by the same procedure except that the current value to be the criterion is changed.

The control system 42 determines the objective lens current values before and after the objective lens current value at which the evaluation value is the maximum among the objective lens current values from which the observation images are acquired. The control system 42 acquires the observation images at a plurality of new objective lens current values within the range of the objective lens current values before and after the objective lens current value at which the evaluation value is the maximum.

For example, a plurality of images are acquired at intervals of a current value smaller than that of the previous time within a range of a current value narrower than that of the previous time. The control system 42 determines the maximum evaluation value among the evaluation values of the plurality of newly obtained observation images. As the method of obtaining the maximum evaluation value described above, in addition to the simple maximum value, it is also possible to use a condition that is obtained by fitting or interpolation with respect to the relationship between the obtained evaluation value and the objective lens current value and at which the evaluation value is considered to be the maximum.

For example, the control system 42 repeats the above processing a predetermined number of times, determines the objective lens current value having the last maximum evaluation value as the optimum value, and sets the current of the objective lens 20 to the current value. The control system 42 may determine whether to end the processing based on another condition. For example, when the change in the evaluation value from the previous time is less than a specified value, the magnitude of the obtained evaluation value exceeds a specified value determined based on the performance of the apparatus or the like, or the range of the objective lens current value or the interval among a plurality of current values for image acquisition is less than a known value, the control system 42 ends the acquisition of the new observation image.

Even in the focus adjustment, as described above, it is clear that the control system 42 may evaluate the observation image under specific conditions and then determine the conditions for acquiring the observation image for adjustment next. Even in this case, it is possible to efficiently obtain the optimum condition using various generally known algorithms for solving the optimization problem such as the steepest descent method or the conjugate gradient method so as to maximize the evaluation value in relation to the value of the objective lens current value. Even in this case, a method of using the reciprocal of the evaluation value as a new evaluation value can be used in combination.

In addition to the objective lens current and the astigmatism correction XY parameter pair, the control system 42 can set, as described above, various adjustment parameters that change the image, such as coma aberration, astigmatism of various orders, the focal length of the lens constituting the optical system, the deflection amount of the deflector, and the intensity of a multipole field.

[User Support for Apparatus Adjustment]

In the above example, the control system 42 automatically determines the values of the adjustment parameters of the SEM apparatus 50 or the STEM apparatus 51. In the example described below, the control system 42 supports the adjustment of the SEM apparatus 50 or the STEM apparatus 51 by the operator. Specifically, the control system 42 displays the evaluation value of a display image or an image that changes in accordance with the evaluation value together with the display image.

FIG. 11 is a flowchart showing an example of a method for supporting the apparatus adjustment by the operator. The control system 42 acquires a present observation image (live image) of the sample 21 (S251). The control system 42 uses the acquired image as the evaluation image and calculates evaluation values at a plurality of levels. Specifically, as described with reference to FIG. 7, the horizontal evaluation value 511, the vertical evaluation value 512, and the comprehensive evaluation value 513 of level 1, and the horizontal evaluation value 521, the vertical evaluation value 522, and the comprehensive evaluation value 523 of level 2 are calculated.

Further, the control system 42 performs the two-dimensional discrete wavelet transform of the transform image 424 of the LL component of level 2 (S255). Accordingly, four level-3-wavelet-transform images are obtained, which are a transform image 431 of 3HL component, a transform image 432 of 3LH component, a transform image 433 of 3HH component, and a transform image 434 of 3LL component.

The control system 42 selects the maximum value of the absolute values of the wavelet transform coefficients in the transform image 431 of the 3HL component (S256), and obtains a horizontal evaluation value 531 of level 3. The control system 42 selects the maximum value of the absolute values of the wavelet transform coefficients in the transform image 432 of the 3LH component (S257), and obtains a vertical evaluation value 532 of level 3. The control system 42 calculates the product of the horizontal evaluation value 531 and the vertical evaluation value 532 (S258), and determines an evaluation value (L3 vertical and horizontal evaluation value) 533 of the evaluation image of level 3. The method for calculating the evaluation value 533 of the evaluation image is the same as or different from that for calculating the evaluation values 513 and 523.

The control system 42 calculates the product of the vertical and horizontal evaluation values 513, 523, and 533 of level 1, level 2, and level 3 (S260), and obtains a comprehensive evaluation value 550. The control system 42 calculates the product of the horizontal evaluation values 511, 521, and 531 of level 1, level 2, and level 3 (S261), and obtains a horizontal comprehensive evaluation value 551. The control system 42 calculates the product of the vertical evaluation values 512, 522, and 532 of level 1, level 2, and level 3 (S262), and obtains a vertical comprehensive evaluation value 552. The control system 42 displays the calculated comprehensive evaluation value 550, the calculated horizontal comprehensive evaluation value 551, and the calculated vertical comprehensive evaluation value 552 on the screen together with the live image (S265).

FIG. 12A shows an example of an image displayed by the display device of the control system 42. The display device displays a live image 470 and evaluation information 480 of the live image 470. The evaluation information 480 includes, in addition to the comprehensive evaluation value 550, the horizontal comprehensive evaluation value 551, and the vertical comprehensive evaluation value 552, an objective lens current value of the live image 470, a target indication value for adjustment, a ratio between the horizontal comprehensive evaluation value and the vertical comprehensive evaluation value, and a conversion value obtained using a predetermined calculation method based on the target indication value and the ratio.

The method for obtaining the indication value described above can be a suitable method according to the apparatus and conditions. As an example, an evaluation value estimated based on an average contrast change amount for a structure having a size of one pixel or less in an observation image, an evaluation value estimated based on apparatus performance including a decomposition ability under the conditions, a maximum value or an average value of the plurality of evaluation values near the maximum value among a plurality of evaluation values obtained by changing only an objective lens current amount or an astigmatism correction parameter to be adjusted in the same observation field or the same observation sample, or the like is used.

As a method for obtaining the conversion value, for example, a numerical value obtained by subtracting 1 from a value of an aspect ratio can be used as the ratio. In this case, a condition corresponding to 1, which is a value of an expected ratio in a condition in which astigmatism is appropriately adjusted, is indicated by 0, and a condition in which the condition is changed from 0 is indicated by positive and negative numbers. The user can perform adjustment so that the conversion value becomes 0. In addition, it is possible to use a ratio between the horizontal comprehensive evaluation value and the vertical comprehensive evaluation value which are obtained by performing evaluation on a plurality of conditions in advance, a difference value which is obtained with the ratio as the criterion, or a product or a sum of relative values of the horizontal comprehensive evaluation value and the vertical comprehensive evaluation value which are obtained based on each of the horizontal comprehensive evaluation value and the vertical comprehensive evaluation value under the optimum condition.

As shown in FIG. 12B, the evaluation information 480 may be displayed in a manner of being superimposed on any position on the live image 470.

FIG. 12C shows an example in which the comprehensive evaluation value 550 is displayed on the screen in a different form. An image 12CA indicates the magnitude of the comprehensive evaluation value 550 using a horizontally long display region. A position in the horizontal direction in the display region corresponds to the magnitude of the comprehensive evaluation value 550. In this example, colors with which the display region is painted and divided are two or more colors. The magnitude of the comprehensive evaluation value 550 is indicated using a ratio or a difference of areas.

Specifically, a left side and a right side of the display region are painted and divided with any two colors. As the comprehensive evaluation value 550 increases, the region painted with the color on the left side spreads toward the right side, and the ratio thereof increases. In the display region, an instruction display or a line indicating the indication value corresponding to the magnitude of the comprehensive evaluation value 550 corresponding to a predetermined state determined based on the performance or conditions of the apparatus may be displayed.

An image 12CB represents the image 12CA using a vertically long display region, and represents a present value by an instruction portion or a line. An image 12CC shows the indication value in the image 12CA by a distribution of colors in the display region. As an example, the left side and the right side of the indication value are painted with different colors. The user compares a present state with the predetermined state depending on which color region the position at which the present value is displayed is. An image 12CD represents the image 12CC using a vertically long display region.

In the images 12CC and 12CD, the number of colors to be displayed is not limited to two, and the images 12CC and 12CD may be painted with any number of colors including a single color. Further, even if a part of the elements constituting the example shown in the images 12CA to 12CD are omitted or other elements are added, the same effect can be attained. In the images 12CA to 12CD, the left and right sides and upper and lower sides may be reversed. Further, even when the images 12CA to 12CD are rotated at any angle, the same effect can be attained. The user can recognize the present state of the apparatus or the magnitude of the comprehensive evaluation value 550 obtained based on the present state depending on the change in the display shown in these examples, and can adjust the apparatus to an appropriate state.

FIG. 12D shows an example in which the comprehensive evaluation value 550 is displayed on the screen in a different form. An image 12DA indicates the magnitude of the comprehensive evaluation value 550 using a circular display region. A direction in which the display is performed when a center position of the display region is set as an origin indicates the magnitude of the comprehensive evaluation value 550. In this example, a downward direction is the origin, and corresponds to a condition in which the comprehensive evaluation value is the minimum or the maximum. As the comprehensive evaluation value 550 increases, the indication portion or the line corresponding to the present value rotates clockwise from the origin. At this time, an angle region from the origin to the present value may be painted with different colors. In the display region, the instruction display or the line indicating the indication value corresponding to the magnitude of the comprehensive evaluation value 550 corresponding to the predetermined state determined by the performance or conditions of the apparatus may be displayed.

An image 12DB shows an example when the present value is the minimum value in the example of the image 12DA. An image 12DC shows an example in which the comprehensive evaluation value 550 is larger than that of the image 12DA. An image 12DD is obtained by displaying the same state as that of the image 12DC using another method. The display region is painted and divided with two colors with the indication value as a boundary. The present value is indicated by the instruction portion or the line. The user compares the present state with the predetermined state depending on which color region the position at which the present value is displayed is.

In any of the examples, the method of changing the display of the present value with respect to the change in the comprehensive evaluation value 550 may be counterclockwise instead of clockwise. The number of colors used for display is not limited to two, and painting may be performed with any number of colors including a single color. Even if a part of the elements constituting the example shown in the image 12DA to the image 12DD are omitted or other elements are added, the same effect can be attained. In the image 12DA to the image 12DD, the left and right sides and upper and lower sides may be reversed. Even when the images 12DA to 12DD are rotated at any angle, the same effect can be attained. The user can recognize the present state of the apparatus or the magnitude of the comprehensive evaluation value 550 obtained based on the present state depending on the change in the display shown in these examples, and can adjust the apparatus to an appropriate state.

FIG. 12E shows an example in which the comprehensive evaluation value 550 is displayed on the screen with circular marks. A line 12EA displays the magnitude of the comprehensive evaluation value 550 with the color in the circular region. Saturation, lightness, or hue of the color in the circular region changes according to the magnitude of the comprehensive evaluation value 550. A line 12EB represents the magnitude of the comprehensive evaluation value 550 by the size of the circular region, and a radius of the circular region changes according to the change of the comprehensive evaluation value 550.

A line 12EC shows an example in which both the size and the color of the circular region change according to the value of the comprehensive evaluation value 550. A line 12ED shows the magnitude of the comprehensive evaluation value 550 with a mark in which a plurality of circles are concentrically superimposed. The larger the comprehensive evaluation value 550, the larger the number of circles constituting the mark and the larger the radius is.

A line 12EE shows the magnitude of the comprehensive evaluation value 550 with a mark in which circles having different colors are superimposed. The larger the comprehensive evaluation value 550, the larger the number of circles constituting the mark and the larger the radius is. The user can recognize the present state of the apparatus or the magnitude of the comprehensive evaluation value 550 obtained based on the present state depending on the change in the circular marks shown in these examples, and can adjust the apparatus to an appropriate state.

FIG. 12F shows an example in which the state of the astigmatism correction is displayed on the screen with the circular marks. The control system 42 represents the horizontal evaluation value and the vertical evaluation value obtained based on the observation image, or an index of an adjustment degree with respect to two directions. The index is obtained by a relative or absolute difference between the optimum value and a present state. The optimum value is obtained based on a difference between the optimum value of the astigmatism correction XY parameters obtained before the horizontal evaluation value or the vertical evaluation value and a present astigmatism correction XY parameter.

A line 12FA represents the index of the adjustment degree with respect to the two directions as lengths of a major axis and a minor axis of an ellipse. A line 12FB represents the index of the adjustment degree with respect to the two directions as a length of each of two lines whose lengths are independently changed. A line 12FC is an example in which a position of an intersection point of two lines in the line 12FB is set as an end of the line and the line is indicated by an arrow. A line 12FD represents the index of the adjustment degree with respect to the two directions in association with vertical and horizontal lengths of a square.

A line 12FE represents the index of the adjustment degree with respect to the two directions with respect to a display portion indicating the origin, here, each direction around a circle, as a width or a height of the display in which lines are arranged. A line 12FF represents the index of the adjustment degree with respect to the two directions by a change in the width and the height of each of the two intersecting squares. The user can adjust the astigmatism of the apparatus to an appropriate state by checking the display and adjusting the apparatus so that the display is isotropic with respect to the vertical and horizontal directions.

FIG. 12G shows an example of a case in which the state of the focus adjustment or the state of the astigmatism correction is displayed on the screen. An image 12GA shows a relative state of the present state with respect to the optimum condition on one axis for one of the X and Y parameters of the focus or the astigmatism correction. The optimum condition at this time is estimated based on the condition corresponding to the adjustment performed in the past, the image obtained by the operation of the user in the past, and the comprehensive evaluation value 550. The difference between the X or Y parameters of the focus or the astigmatism correction from the optimum condition, or a relative difference obtained based on the value of the comprehensive evaluation value 550 is indicated by being rounded on the axis.

An image 12GB represents the present condition in the image 12GA by a triangular instruction portion. An image 12GC represents the present condition in the image 12GA by a line. An image 12GD shows the relative state of the present state with respect to the optimum condition on two axes for the state of astigmatism correction. The optimum condition at this time is estimated from the condition corresponding to the adjustment performed in the past, the image obtained by the operation of the user in the past, and the comprehensive evaluation value 550. The difference of the X parameter or Y parameter of the astigmatism correction from the optimum condition is represented as a position with respect to the origin.

The control system 42 can assist the user to recognize the present state by displaying a diagram corresponding to FIG. 5 or 9 on the display device using the correction processing performed in the past or the condition operated by the user in the past and the value of the comprehensive evaluation value 550 obtained at that time, and further displaying a display indicating the present observation conditions together therewith.

The operator can adjust various control parameters including the objective lens current value of the SEM apparatus 50 or the STEM apparatus 51 or the aberration correction parameter through the control system 42 while referring to the displayed evaluation information 480, and can find the optimum condition.

The method for calculating the evaluation value of the live image may be different from the above example. For example, a single-level evaluation value may be used, results of all levels excluding a highest level or a lowest level among the acquired evaluation results of a plurality of levels may be used, or only evaluation results of any plurality of levels according to conditions for evaluation may be used. When the plurality of levels of evaluation values are calculated, the number of levels can be changed as necessary. In many cases, the number of levels can be set to any number within a range equal to or less than a maximum value determined by the number of pixels constituting the evaluation image. The control system 42 can similarly display evaluation information for the astigmatism correction XY parameter pair and other adjustment parameters in addition to the objective lens current.

[Presentation of Sample Shape Information]

Hereinafter, a method for specifying a surface structure of the sample using the evaluation value and presenting information thereof will be described. When the primary electron beam is focused on a certain position on the sample surface, the objective lens current value corresponds to a surface height of the sample at that position. By measuring the objective lens current value at which the primary electron beam is focused on each position on the sample surface, information on the shape (uneven shape, curve, or the like) of the sample surface can be obtained.

FIG. 13 is a flowchart showing a method for measuring the shape of the sample surface. The control system 42 sets the current value of the objective lens 20 to a start value set in advance (S301). The control system 42 acquires an observation image (evaluation image) of the sample 21, and stores the observation image in the storage device together with the present current value of the objective lens 20 (S302). The control system 42 generates a plurality of images obtained by dividing the acquired image into individual regions or a plurality of images obtained by masking regions other than the individual regions (S303). The control system 42 calculates an evaluation value at each position of the observation image (S304). The control system 42 stores a distribution (a relationship between the position and the evaluation value) of the evaluation value in each individual region on the observation image in the storage device. The calculation of the evaluation value may be performed using any of the methods described above.

The control system 42 determines whether the present current value of the objective lens 20 is an end value set in advance (S305). When the present current value of the objective lens 20 is not the end value (S305: NO), the control system 42 changes the current value of the objective lens 20 by a predetermined value (S306). Further, the control system 42 returns to step S302.

When the present current value of the objective lens 20 is the end value (S305: YES), the control system 42 determines the relationship between the current value of the objective lens 20 and the evaluation value in each individual region on the observation image stored in the storage device (S307). As described above, the control system 42 determines the relationship between the current value of the objective lens 20 and the evaluation value by performing, for example, Gaussian or fitting of a polynomial expression, or compensation such as Lagrange compensation, Hermitian compensation, or spline compensation.

The control system 42 determines the current value of the objective lens 20 at which the evaluation value is the maximum in each individual region based on the relationship between the current value of the objective lens 20 and the evaluation value in each individual region determined in step S307 (S308).

The control system 42 calculates the height of each individual region based on the current value of the objective lens 20 at which the evaluation value in each individual region is the maximum (S309) The control system 42 holds in advance information defining the relationship between the current value and the height of the objective lens 20, and determines the height with reference to the information. Accordingly, the distribution of the height on the sample surface is obtained. The control system 42 generates an image indicating the height of each individual region of the sample surface, and displays the image on the display device (S310).

FIG. 14 shows an example when the height of each region of the sample is displayed on the screen based on the focusing condition in each local region. An image 14A shows an appearance of the sample having a three-dimensional structure. The sample is constituted by portions having a plurality of heights. Regions having the same height on the upper surface of the sample are a region A, a region B, and a region C.

An image 14B shows an example of an image obtained by observing the sample shown in the image 14A from the upward direction (the negative direction on the Z axis shown in the image 14A). Although an image obtained by observation includes each of the region A, the region B, and the region C in the field, a difference in height among the regions cannot be distinguished from a single image.

An observation image of the region is acquired under each of a plurality of conditions in which the current value of the objective lens used for observation or a focus position corresponding to the current value is changed. As shown in an image 14C, each of the obtained images is divided into regions A1 to A3, B1 to B3, and C1 to C3, and an evaluation value of the image is calculated in each region using the method described above. When a correspondence relationship between the evaluation value obtained in each region and the current value of the objective lens when the image is acquired or the focus position corresponding thereto is obtained, the relationship between the objective lens current value and the evaluation value as already shown in FIGS. 6A and 6B is obtained.

It is possible to obtain the value of the objective lens current value corresponding to the condition in which the evaluation value becomes the maximum, the condition corresponding to the maximum value obtained by performing interpolation on the result in the vicinity of the maximum value, or the condition corresponding to the maximum value obtained by fitting the function to the above relationship between the objective lens current value and the evaluation value. Since the obtained objective lens current value corresponds to the position of the focus, a relative distribution of the focus position in each local region in the image can be obtained. When the observation image is an SEM image, the focus position in each region corresponds to the height of the sample surface, and thus the three-dimensional structure of the sample can be obtained by converting the obtained distribution of the focus position.

An image 14D is an example in which the height distribution in the image obtained for the sample shown in the image 14A is shown as a difference in color. Since the regions A, B, and C have the same height, the regions A, B, and C are shown in the same color. Since the regions A, B, and C have different heights, the regions A, B, and C are shown in different colors. An image 14E is an example in which the height distribution of the sample shown in the image 14D is shown on the screen as a three-dimensional structure. As compared with the display based on the two-dimensional distribution shown in the image 14D, the user can more easily recognize the three-dimensional structure of the sample, and can evaluate the information of coordinates of a selected portion in the three-dimensional space by selecting any portion in the displayed structure.

FIGS. 15A, 15B, and 15C show another example of obtaining the evaluation value from the observation image. FIG. 15A shows an example of the observation image. FIG. 15B is a graph showing the histogram of the absolute values of the first coefficients obtained by performing the one-direction discrete wavelet transform on FIG. 15A. A horizontal axis of the graph represents the magnitude of the absolute value of the coefficient. A vertical axis represents the number of occurrences of the coefficient having each magnitude.

Here, a reference numeral 15B1 indicates a portion corresponding to a largest coefficient among the coefficients obtained based on the observation image. Obtaining the maximum value of the absolute values of the obtained coefficients is equivalent to obtaining the value at the end of such a histogram. A reference numeral 15B2 indicates a portion corresponding to a second largest coefficient among the coefficients obtained based on the observation image. A reference numeral 15B3 indicates a portion corresponding to a third largest coefficient among the coefficients obtained based on the observation image.

In many cases, since the observation image includes various fine structures, such a histogram often shows a continuous distribution. In a state in which a finer structure is provided in the image, such as a state in which the image is in focus or a state in which the astigmatism is appropriately adjusted, the obtained coefficient changes in a direction in which the obtained coefficient increases as a whole.

At this time, in addition to the maximum value of the coefficient indicated by the reference numeral 15B1, the values of the second and third largest coefficients indicated by the reference numerals 15B2 and 15B3 are also increased. Therefore, in addition to the maximum value of the coefficient, even a numerical value corresponding to an order designated in the order related to the magnitude, such as the second and third largest values of the coefficient, can be used as the evaluation value of the image. In a state in which the image includes the finer structure as described above, the obtained coefficient changes in a direction in which the coefficient increases as a whole. Therefore, an average value or a total sum value of the obtained coefficients can also be used as the evaluation value of the image.

FIG. 15C shows a result of fitting the function to the histogram of the coefficients shown in FIG. 15B. A broken line graph indicated by a reference numeral 15C1 indicates a function obtained by fitting. Points indicated by a reference numeral 15C2 are points corresponding to a result obtained by extrapolating a portion (a portion intersecting the horizontal axis) where the value of the function obtained by fitting is 0.

As described above, in a state in which the finer structure is provided in the image, the obtained coefficient changes in the direction in which the coefficient increases as a whole, and the histogram changes in a manner of spreading to the right side. Therefore, a coefficient such as a slope of the function fitted to the coefficient or a point at which the value as indicated by the reference numeral 15C2 is 0 (a portion intersecting the horizontal axis) is obtained. The value as indicated by the reference numeral 15C2 is obtained based on the fitted function. A value of the magnitude of the horizontal axis at that time or the like is regarded as the magnitude of the coefficient, and can be used as the evaluation value of the image.

[Other Calculation Method of Evaluation Value]

Hereinafter, a method for determining the evaluation value by transform different from the wavelet transform will be described. First, a method for calculating the evaluation value by a windowed Fourier transform will be described. In the windowed Fourier transform, in general, a window function is applied to an evaluation target, and the Fourier transform is performed after only information of a local region is selected. An example of the window function at this time is a two-dimensional Gaussian window, which is represented as W(x,y) below.

$$W(x, y) = \exp\left(-\frac{(x-x_0)^2 + (y-y_0)^2}{\sigma^2}\right) \quad \text{[Formula 9]}$$

Here, x0 and y0 respectively represent X and Y coordinates of a center of the local region selected using the window function. σ is a parameter corresponding to the spread of the window function. In addition, as the window function, a generally known window function such as a Hanning window, a Hamming window, a Kaiser window, or a rectangular window can be used.

An evaluation image (M×N pixels) is represented by I(x,y). Here, 0≤x≤M−1 and 0≤y≤N−1 are satisfied. When the image after the window function is applied is f(x,y), the application of the window function to the evaluation image is represented as follows.

$$f(x,y)=I(x,y)*W(x,y) \quad \text{[Formula 10]}$$

Here, the region in which W(x,y) is 0 may be excluded from the region constituting f(x,y), and only a minimum rectangular region including all the regions in which W(x,y) is not 0 can be used as f(x,y).

A method for evaluating f(x,y) (M×N pixels) corresponding to information of a local region will be described. Here, 0≤x≤M−1 and 0≤y≤N−1 are satisfied. The horizontal one-dimensional discrete Fourier transform is represented as follows.

$$H(u, y) = \sum_{x=0}^{M-1} f(x, y)e^{-2\pi i\left(\frac{ux}{M}\right)} \quad \text{[Formula 11]}$$

The vertical one-dimensional discrete Fourier transform is represented as follows.

$$V(x, v) = \sum_{y=0}^{N-1} f(x, y)e^{-2\pi i\left(\frac{vy}{N}\right)} \quad \text{[Formula 12]}$$

Here, a spectral function S(r) is defined for H(u,y) and V(x,v) as follows.

$$S(r) = \sum_{y=0}^{N-1} \frac{H(r, y)}{N} \quad \text{[Formula 13]}$$

$$S(r) = \sum_{y=0}^{N-1} \frac{V(x, r)}{M}$$

For each spectral function S(r), for example, a value obtained by any one of the following conditions (A) to (C) can be used as the horizontal evaluation value and the vertical evaluation value in the region.

(A) A minimum r among r satisfying S(r)=S(0)/e (e is a Napier's number which is a base of a natural logarithm).

(B) A minimum r Among r satisfying S(r)=S(0)/C (C is a predetermined constant).

(C) When r in S(r) is 0≤r≤lC−1, T(l) or T(pt) corresponding to a predetermined threshold pt among integral values T(p) in each range p of r defined below.

$$T(p) = \sum_{d=0}^{C-1} S(Cp + d) \quad \text{[Formula 14]}$$

$$0 \le p \le l$$

S(0) used above can attain the same effect as long as S(0) corresponds to a region in which r is relatively small in the spectral function S(r). For example, an average value of S(r) in all r which is 5% or less of the maximum value of r, a value obtained by excluding only S(0) from the average value, or the like can be used.

As described above, the horizontal evaluation value and the vertical evaluation value of the partial region of the evaluation image can be determined. For example, the control system 42 can determine the horizontal evaluation value and the vertical evaluation value of the evaluation image by determining the horizontal evaluation values and the vertical evaluation values of all the partial regions of the surface image and selecting the maximum horizontal evaluation value and the maximum vertical evaluation value from the horizontal evaluation values and the vertical evaluation values. In the above [Formula 14], p represents a specific spatial frequency band having a width, and thus is an index having a characteristic similar to the level of the wavelet transform described above. Therefore, when the windowed Fourier transform is used as a substitute for the wavelet transform in the present method, p can be used as a substitute parameter of a level for the wavelet transform.

Next, an example of calculating the evaluation value by a windowed discrete cosine transform will be described. In this case, similarly to the calculation method of the evaluation value by the windowed Fourier transform described above, the window function, for example, W(x,y) [Formula 9] is generally applied to the evaluation target, and the processing is performed on the image f(x,y) [Formula 10] obtained by selecting only the information on the local region obtained thereby.

A method for calculating the evaluation value for the image f(x,y) (M×N pixels) in which only the information of the local region is selected will be described. Here, 0≤x≤M−1 and 0≤y≤N−1 are satisfied. The horizontal one-dimensional discrete cosine transform is represented as follows.

$$H(u, y) = c_u \sum_{x=0}^{M-1} f(x, y) \cos\left[\frac{(2x+1)u\pi}{2M}\right], 0 \le u \le M-1 \quad \text{[Formula 15]}$$

The vertical one-dimensional discrete cosine transform is represented as follows.

$$V(x, v) = c_v \sum_{y=0}^{N-1} f(x, y) \cos\left[\frac{(2y+1)v\pi}{2N}\right], 0 \le v \le N-1 \quad \text{[Formula 16]}$$

CuCv is represented as follows.

$$c_u = \begin{cases} \frac{1}{\sqrt{M}}, & u = 0 \\ \sqrt{\frac{2}{M}}, & 1 \le u \le M-1 \end{cases} \quad c_v = \begin{cases} \frac{1}{\sqrt{N}}, & v = 0 \\ \sqrt{\frac{2}{N}}, & 1 \le v \le N-1 \end{cases} \quad \text{[Formula 17]}$$

Here, a spectral function S(r) is defined for H(u,y) and V(x,v) as follows.

$$S(r) = \sum_{y=0}^{N-1} \frac{H(r, y)}{N}$$

$$S(r) = \sum_{y=0}^{M-1} \frac{V(x, r)}{M} \quad \text{[Formula 18]}$$

For each spectral function S(r), for example, a value obtained by any one of the following conditions (A) to (C) can be used as the horizontal evaluation value and the vertical evaluation value in the region.

(A) A minimum r among r satisfying S(r)=S(0)/e (e is a Napier's number which is a base of a natural logarithm).

(B) A minimum r among r satisfying S(r)=S(0)/C (C is a predetermined constant).

(C) When r in S(r) is 0≤r≤lC−1, T(l) or T(pt) corresponding to a predetermined threshold pt among integral values T(p) in each range p of r defined below.

$$T(p) = \sum_{d=0}^{C-1} S(Cp + d) \quad \text{[Formula 19]}$$

$$0 \le p \le l$$

S(0) used above can attain the same effect as long as S(0) corresponds to a region in which r is relatively small in the spectral function S(r). For example, an average value of S(r) in all r which is 5% or less of the maximum value of r, a value obtained by excluding only S(0) from the average value, or the like can be used.

As described above, the horizontal evaluation value and the vertical evaluation value of the partial region of the evaluation image can be determined. For example, the control system 42 can determine the horizontal evaluation value and the vertical evaluation value of the evaluation image by determining the horizontal evaluation values and the vertical evaluation values of all the partial regions of the surface image and selecting the maximum horizontal evaluation value and the maximum vertical evaluation value from the horizontal evaluation values and the vertical evaluation values. In the above [Formula 19], p represents a specific spatial frequency band having a width, and thus is an index having a characteristic similar to the level of the wavelet transform described above. Therefore, when the windowed Fourier transform is used as a substitute for the wavelet transform in the present method, p can be used as a substitute parameter of a level for the wavelet transform.

Next, an example of calculating an evaluation value by convolution of a differential filter will be described. The two-dimensional image (evaluation image) (M×N pixels) before transform is represented as a function f(x,y) in an xy space. Here, 0≤x≤M−1 and 0≤y≤N−1 are satisfied. A result obtained by convolving a kernel K(p,q) (0≤p≤l−1 and 0≤q≤m−1) with the function f(x,y) is as follows.

$$C(j, k) = \sum_{p=0}^{l-1} \sum_{q=0}^{m-1} K(p, q) f(j - p + 1, k - q + 1), \quad \text{[Formula 20]}$$

$$0 \le j \le M - 1$$
$$0 \le k \le N - 1$$

The maximum value of C(j,k) obtained by the differential filter in the horizontal direction as the kernel K(p,q) can be used as the horizontal evaluation value. The maximum value of C(j,k) obtained by the differential filter in the vertical direction as the kernel K(p,q) can be used as the vertical evaluation value. Examples of differential filters include, for example, first-order differential filters, Sobel filters, and Prewitt filters.

Various filters (high-pass filters) that obtain information on fineness of the image, including the above differential filter, can be applied to the calculation of the evaluation value. The kernel operating as such a high-pass filter is a one-dimensional or two-dimensional (or N-dimensional) matrix in which the constituent elements are a plurality of real numbers or complex numbers, and has both positive and negative numbers as coefficients of real parts or imaginary parts of a plurality of numbers constituting the matrix.

On the other hand, a kernel constituted by elements all having the same sign operates basically as a low-pass filter, and information obtained thereby has a complementary relationship with information obtained using the high-pass filter. Therefore, by subtracting the information obtained using the low-pass filter from the original information, a coefficient equivalent to the coefficient obtained using the high-pass filter can be obtained without convolution.

The invention is not limited to the above-descried embodiment, and includes various modifications. For example, the embodiment described above is described in detail for easy understanding of the invention, and the invention is not necessarily limited to those including all the configurations described above. A part of a configuration according to one embodiment can be replaced with the configuration according to another embodiment, and the configuration according to another embodiment can be added to the configuration according to one embodiment. A part of the configuration according to each embodiment may be added to, deleted from, or replaced with another configuration.

Each of the above-described configurations, functions, process units, and the like may be partially or entirely implemented by hardware such as through design using an integrated circuit. The above-described configurations, functions, and the like may be implemented by software by means of a processor interpreting and executing a program for implementing the functions. Information of programs, tables, files or the like for implementing the functions can be placed in a recording device such as a memory, a hard disk, and a solid state drive (SSD), or a recording medium such as an IC card and an SD card.

Control lines and information lines are those that are considered necessary for the description, and not all the control lines and the information lines on the product are necessarily shown. In practice, it may be considered that almost all the configurations are connected to one another.

The invention claimed is:

1. A charged particle beam system comprising:
a charged particle beam apparatus; and
a control system that analyzes an image obtained by the charged particle beam apparatus, wherein
the control system
obtains a first coefficient by performing multiple resolution analysis based on wavelet transform or discrete wavelet transform on at least a part of an image or a signal acquired by the charged particle beam apparatus, and
obtains a second coefficient by performing, on at least a part of the first coefficient or an absolute value of the first coefficient, any one of calculation of a maximum value, calculation of a numerical value corresponding to a specified order in an order related to a magnitude, fitting to a histogram, calculation of an average value, and calculation of a total sum.

2. A charged particle beam system, comprising:
a charged particle beam apparatus; and
a control system that analyzes an image obtained by the charged particle beam apparatus, wherein
the control system
obtains a first coefficient by performing one of multiple resolution analysis, Fourier transform, and convolution operation based on wavelet transform or discrete wavelet transform on at least a part of an image or a signal acquired by the charged particle beam apparatus, obtains a second coefficient by performing, on at least a part of the first coefficient or an absolute value of the first coefficient, any one of calculation of a maximum
obtains a second coefficient by performing, on at least a part of the first coefficient or an absolute value of the first coefficient, any one of calculation of a maximum value, calculation of a numerical value corresponding to a specified order in an order related to a magnitude, fitting to a histogram, calculation of an average value, and calculation of a total sum, and
obtains a third coefficient by obtaining any one of a product, a sum, and an average value obtained using the product or the sum for a plurality of the obtained second coefficients.

3. The charged particle beam system according to claim 1, wherein
the control system performs the multiple resolution analysis based on the wavelet transform or the discrete wavelet transform on the image or the signal acquired by the charged particle beam apparatus, and
the first coefficient is a coefficient obtained by performing the multiple resolution analysis based on the wavelet transform or the discrete wavelet transform on one direction or two or more different directions.

4. The charged particle beam system according to claim 2, wherein
the control system performs convolution calculation on the image or the signal acquired by the charged particle beam apparatus,
an element of a kernel or a filter used in the convolution calculation is a complex number,
a coefficient of a real part or an imaginary part of the complex number is both a positive number and a negative number, or all of the coefficients of the real part or the imaginary part of the complex number have only a positive or negative sign, and
a control system subtracts a result obtained by the convolution calculation from an original image or signal, or from an image or signal acquired under the same condition as the original image or signal.

5. The charged particle beam system according to claim 2, wherein
the first coefficient is a coefficient obtained using a plurality of different kernels or filters as a kernel or a filter used for the convolution calculation.

6. The charged particle beam system according to claim 5, wherein
the plurality of different kernels or filters are obtained by rotating a single kernel or filter in one or more different directions.

7. The charged particle beam system according to claim 1, wherein
the first coefficient is a coefficient obtained at a plurality of resolutions or levels among coefficients obtained by the multiple resolution analysis based on the discrete wavelet transform.

8. The charged particle beam system according to claim 7, wherein
the second coefficient is obtained by performing, on at least a part of a coefficient obtained at each resolution or level or an absolute value of the coefficient obtained at each resolution or level among the first coefficients, any one of calculation of a maximum value, calculation of a numerical value corresponding to a specified order in an order related to a magnitude, fitting to a histogram, calculation of an average value, and calculation of a total sum.

9. The charged particle beam system according to claim 1, wherein
the control system acquires a plurality of images or signals under a plurality of conditions having different parameter values for image acquisition, and determines a parameter value for acquiring a new image based on a value of the second coefficient obtained for at least a part of the plurality of images or signals.

10. The charged particle beam system according to claim 2, wherein the control system acquires a plurality of images or signals under a plurality of conditions having different parameter values for image acquisition, and determines a parameter value for acquiring a new image based on a value of the third coefficient obtained for at least a part of the plurality of images or signals.

11. The charged particle beam system according to claim 9, wherein the plurality of conditions having different parameter values for image acquisition are a plurality of conditions in which at least one of a parameter value used for focus adjustment and a parameter value used for aberration adjustment is different.

12. The charged particle beam system according to claim 11, wherein the aberration adjustment is adjustment of astigmatism.

13. The charged particle beam system according to claim 9, wherein the control system determines the parameter value for acquiring a new image by obtaining a condition under which a value of the second coefficient is the maximum, or a condition obtained by performing fitting, interpolation, or calculation of a center of gravity on a relationship between the parameter value for image acquisition and the second coefficient.

14. The charged particle beam system according to claim 10, wherein the control system determines the parameter value for acquiring a new image by obtaining a condition under which a value of the third coefficient is the maximum, or a condition obtained by performing fitting, interpolation, or calculation of a center of gravity on a relationship between the parameter value for image acquisition and the third coefficient.

15. The charged particle beam system according to claim 1, wherein the control system changes display in accordance with a value of the second coefficient.

16. The charged particle beam system according to claim 2, wherein the control system changes display in accordance with a value of the third coefficient.

17. The charged particle beam system according to claim 1, wherein the control system obtains, based on a magnitude of the second coefficient obtained for a part of the image or the signal acquired under a plurality of conditions having different parameter values for image acquisition, a parameter value at which the second coefficient is the maximum in a plurality of regions in the image or the signal, or a parameter value obtained by performing fitting, interpolation, or calculation of a center of gravity on a relationship between the parameter value for image acquisition and the second coefficient.

18. The charged particle beam system according to claim 2, wherein the control system obtains, based on a magnitude of the third coefficient obtained for a part of the image or the signal acquired under a plurality of conditions having different parameter values for image acquisition, a parameter value at which the third coefficient is the maximum in a plurality of regions in the image or the signal, or a parameter value obtained by performing fitting, interpolation, or calculation of a center of gravity on a relationship between the parameter value for image acquisition and the third coefficient.

19. The charged particle beam system according to claim 17, wherein the control system applies a predetermined formula to the obtained parameter value to obtain any one of a distribution of focusing conditions, a distribution of heights of a sample, and a three-dimensional structure of the sample in each of the plurality of regions in the image or the signal.

20. The charged particle beam system according to claim 18, wherein the control system applies a predetermined formula to the obtained parameter value to obtain any one of a distribution of focusing conditions, a distribution of heights of a sample, and a three-dimensional structure of the sample in each of the plurality of regions in the image or the signal.

* * * * *